(12) United States Patent
Tilton et al.

(10) Patent No.: US 6,857,283 B2
(45) Date of Patent: Feb. 22, 2005

(54) SEMICONDUCTOR BURN-IN THERMAL MANAGEMENT SYSTEM

(75) Inventors: Charles L. Tilton, Colton, WA (US); Tahir Cader, Pullman, WA (US); Benjamin H. Tolman, Moscow, ID (US); Nathan G. Muoio, Pullman, WA (US)

(73) Assignee: Isothermal Systems Research, Inc., Clarkston, WA (US)

( * ) Notice: Subject to any disclaimer, the term of this patent is extended or adjusted under 35 U.S.C. 154(b) by 0 days.

(21) Appl. No.: 10/243,683

(22) Filed: Sep. 13, 2002

(65) Prior Publication Data

US 2004/0051545 A1 Mar. 18, 2004

(51) Int. Cl.[7] .............................. F28D 5/00; F28D 3/00; F28C 1/00; F28F 7/00

(52) U.S. Cl. .......................... 62/259.2; 62/121; 62/310; 62/171; 165/80.4

(58) Field of Search ................................ 62/259.2, 310, 62/121, 314, 304, 171; 165/80.4

(56) References Cited

U.S. PATENT DOCUMENTS

| | | | | |
|---|---|---|---|---|
| 3,589,160 A | * | 6/1971 | Gruver et al. ................. | 72/201 |
| 3,915,216 A | * | 10/1975 | Fekete et al. ................ | 164/455 |
| 4,056,949 A | * | 11/1977 | Hahn ........................... | 62/373 |
| 4,110,999 A | * | 9/1978 | Dvirka ......................... | 62/171 |
| 4,243,441 A | * | 1/1981 | Wilson ........................ | 148/508 |
| 5,105,168 A | | 4/1992 | DaSilva ......................... | 331/2 |
| 5,220,804 A | | 6/1993 | Tilton et al. ................... | 62/64 |
| 5,314,529 A | | 5/1994 | Tilton et al. ................... | 96/204 |
| 5,359,285 A | | 10/1994 | Hashinaga et al. ....... | 324/158.1 |
| 5,380,956 A | | 1/1995 | Loo et al. .................... | 174/252 |

(List continued on next page.)

OTHER PUBLICATIONS

Spray Quench System for Directional Solidification Furnaces Website Printout Believed to have been first published on Jun. 4, 2002, 2 Pages.
NASA Website Unknown NASA SBIR Successes p. 1.
Using Inkjet Technology to Cool Computer Chips, Aug. 13, 2002, www.hpl.hp.com/news/2002/apr–jun/cooling.html pp. 1–7.
Thermal Challenges During Microprocessor Testing Jun. 2001, Pooya Tadayon, pp. 1–8.
Thermal Management of Multichip Modules with Evaporative Spray Cooling, 1999, Greg Pautsch and Avram Bar–Cohen, EEP–vol. 26–2.
Temperature Control During Test and Burn–In, David Gardell.
Thermal Aspects of Burn–In for High–Power Semiconductor Devices, 2002, Harold E. Hamilton, Micor Control Company.

Primary Examiner—William C. Doerrler
(74) Attorney, Agent, or Firm—Michael S. Neustel

(57) ABSTRACT

A semiconductor burn-in thermal management system for providing an effective thermal management system capable of maintaining a desired semiconductor temperature during a burn-in cycle. The semiconductor burn-in thermal management system includes a reservoir for storing a volume of fluid, a pump fluidly connected to the reservoir, and a plurality of spray units fluidly connected to the pump. The spray units dispense the fluid upon the surface of the semiconductor during burn-in thereby maintaining a relatively constant surface temperature. Each of the spray units preferably includes a stationary first portion with a second portion movably positioned within the first portion in a biased manner. When burning in semiconductors without an integrated heat sink that are deeply recessed within the sockets of a burn-in board, the fluid pressure to the second portion is increased thereby extending the second portion from the first portion thereby reducing the effective distance from the surface of the semiconductor.

20 Claims, 18 Drawing Sheets

U.S. PATENT DOCUMENTS

| | | | |
|---|---|---|---|
| 5,461,328 A | 10/1995 | Devereaux et al. | 324/765 |
| 5,515,910 A | 5/1996 | Hamilton et al. | 165/30 |
| 5,532,610 A | 7/1996 | Tsujide et al. | 324/757 |
| 5,541,524 A | 7/1996 | Tuckerman et al. | 324/754 |
| 5,579,826 A | 12/1996 | Hamilton et al. | 165/254 |
| 5,582,235 A | 12/1996 | Hamilton et al. | 165/263 |
| 5,701,748 A * | 12/1997 | Phelps et al. | 62/91 |
| 5,713,327 A | 2/1998 | Tilton et al. | 123/299 |
| 5,718,117 A * | 2/1998 | McDunn et al. | 62/64 |
| 5,797,274 A | 8/1998 | Jackaman et al. | 62/171 |
| 5,860,602 A | 1/1999 | Tilton et al. | 239/548 |
| 5,880,931 A | 3/1999 | Tilton et al. | 361/690 |
| 5,909,123 A | 6/1999 | Budnaitis | 324/760 |
| 5,933,700 A | 8/1999 | Tilton | 419/6 |
| 5,966,022 A | 10/1999 | Budnaitis et al. | 324/760 |
| 5,992,159 A | 11/1999 | Edwards et al. | 62/64 |
| 6,016,969 A | 1/2000 | Tilton et al. | 239/1 |
| 6,046,060 A | 4/2000 | Budnaitis | 438/10 |
| 6,104,610 A | 8/2000 | Tilton et al. | 361/699 |
| 6,108,201 A | 8/2000 | Tilton et al. | 361/689 |
| 6,114,868 A | 9/2000 | Nevill | 324/760 |
| 6,115,251 A | 9/2000 | Patel et al. | 361/699 |
| 6,175,498 B1 | 1/2001 | Conroy et al. | 361/704 |
| 6,181,143 B1 | 1/2001 | Ghoshal | 324/752 |
| 6,205,799 B1 | 3/2001 | Patel et al. | 62/132 |
| 6,288,371 B1 | 9/2001 | Hamilton et al. | 219/530 |
| 6,307,388 B1 | 10/2001 | Friedrich et al. | 324/754 |
| 6,317,326 B1 | 11/2001 | Vogel et al. | 361/704 |
| 6,320,389 B1 | 11/2001 | Tamesue et al. | 324/509 |
| 6,349,554 B2 | 2/2002 | Patel et al. | 62/259.2 |
| 6,354,370 B1 * | 3/2002 | Miller et al. | 165/263 |
| 6,359,456 B1 | 3/2002 | Hembree et al. | 324/754 |
| 6,389,225 B1 | 5/2002 | Malinoski et al. | 392/479 |
| 6,421,240 B1 | 7/2002 | Patel | 361/699 |
| 6,484,521 B2 * | 11/2002 | Patel et al. | 62/171 |
| 6,557,622 B2 * | 5/2003 | Frank et al. | 164/455 |
| 6,604,370 B2 | 8/2003 | Bash et al. | 62/171 |
| 6,612,120 B2 | 9/2003 | Patel et al. | 62/171 |
| 6,644,058 B2 * | 11/2003 | Bash et al. | 62/259.2 |
| 2001/0002541 A1 | 6/2001 | Patel et al. | 62/259.2 |
| 2001/0050164 A1 | 12/2001 | Wagner et al. | 165/104.33 |
| 2002/0050144 A1 | 5/2002 | Patel et al. | 62/259.2 |

\* cited by examiner

SEMICONDUCTOR BURN-IN THERMAL MANAGEMENT SYSTEM

CROSS REFERENCE TO RELATED APPLICATIONS

Not applicable to this application.

STATEMENT REGARDING FEDERALLY SPONSORED RESEARCH OR DEVELOPMENT

Not applicable to this application.

BACKGROUND OF THE INVENTION

1. Field of the Invention

The present invention relates generally to semiconductor burn-in systems and more specifically it relates to a semiconductor burn-in thermal management system for providing an effective thermal management system capable of maintaining a desirable junction temperature spread amongst a batch of semiconductors being burned-in simultaneously.

2. Description of the Related Art

Thermal management systems for semiconductor burn-in equipment have been in use for years. Conventional thermal management systems utilized today are comprised of, for example, either air-cooled enclosures, or fluid-cooled cold plates. Upcoming technologies include refrigeration systems or other two-phase based technologies.

When producing semiconductors, manufacturers typically perform three different tests on the semiconductors prior to shipping: (1) sort, (2) burn-in, and (3) class testing. Sort test requires maintaining the wafers at a modest temperature, e.g. 35° Celsius, while the wafers are probed for defects. Conventional fluid-cooled cold plates are employed at this stage. Projected heat fluxes, even at the wafer sort, are pointing to the fact that a more effective thermal management technology is needed at this stage.

Burn-in of the semiconductors is typically accomplished utilizing elevated voltages and temperatures in a process that raises the junction temperatures of a batch of semiconductors. The lifespan of a semiconductor is closely related to its operating temperature wherein operating under increased temperatures reduces the effective lifespan of the semiconductor. By applying increased voltages and temperatures to a semiconductor, the weaker semiconductors will fail during testing. The length of the burn-in of semiconductors is directly tied to the median junction temperature of the batch of semiconductors. It is therefore important to maintain a relatively narrow junction temperature spread that provides a higher median temperature. For example, a poor thermal management system can produce a junction temperature spread from 75° to 125° Celsius resulting in a low median junction temperature, longer burn-in time and higher associated burn-in costs. Modern fluid-based thermal management systems are currently able to lower the junction temperature spread to approximately 95° to 110° Celsius thereby reducing burn-in time and burn-in costs.

Class test is the final step in the testing process and is comprised of a final series of tests to validate functionality and quantify speeds. During class test, non-uniform heating of the semiconductors typically occurs. A semiconductor's speed is typically derated by 0.15% for every degree Celsius rise above the target temperature (junction temperature, Tj). It is therefore important to maintain the temperature of the semiconductors relatively close to the target temperature (Tj).

Due to increasing chip heat fluxes (projected to exceed 125 W/cm$^2$ by the year 2004), conventional thermal management systems for semiconductor burn-in are reaching their cooling limits. A further problem with conventional thermal management systems is that they are inefficient, complex, costly to implement and costly to operate. A further problem with conventional thermal management systems is that the resulting junction temperature spreads result in relatively long burn-in times of the semiconductor devices. Another problem with conventional thermal management systems is that they require significant amounts of power to operate.

Examples of patented devices which may be related to the present invention include U.S. Pat. No. 5,579,826 to Hamilton et al.; U.S. Pat. No. 5,582,235 to Hamilton et al.; U.S. Pat. No. 5,515,910 to Hamilton et al.; U.S. Pat. No. 5,359,285 to Hashinaga et al.; U.S. Pat. No. 6,389,225 to Malinoski et al.; U.S. Pat. No. 6,114,868 to Nevill; U.S. Pat. No. 5,461,328 to Devereaux et al.; U.S. Pat. No. 6,181,143 to Ghoshal; U.S. Pat. No. 6,288,371 to Hamilton et al.; U.S. Pat. No. 5,532,610 to Tsujide et al.; U.S. Pat. No. 6,307,388 to Friedrich et al.; U.S. Pat. No. 6,175,498 to Conroy et al.; U.S. Pat. No. 6,359,456 to Hembree et al.; U.S. Pat. No. 5,541,524 to Tuckerman et al.; U.S. Pat. No. 5,220,804 to Tilton et al.; U.S. Pat. No. 6,016,969 to Tilton et al.; U.S. Pat. No. 6,108,201 to Tilton et al.; U.S. Pat. No. 6,104,610 to Tilton et al.; U.S. Pat. No. 5,933,700 to Tilton; U.S. Pat. No. 5,880,931 to Tilton et al.; U.S. Pat. No. 5,933,700 to Tilton; U.S. Pat. No. 5,713,327 to Tilton et al.; U.S. Pat. No. 5,860,602 to Tilton et al.; U.S. Pat. No. 5,314,529 to Tilton et al.; U.S. Pat. No. 6,205,799 to Patel et al.; U.S. Pat. No. 6,349,554 to Patel et al.; U.S. Pat. No. 5,380,956 to Loo et al.; U.S. Pat. No. 6,115,251 to Patel et al.; U.S. Pat. No. 6,421,240 to Patel; and U.S. Pat. No. 6,317,326 to Vogel et al. Examples of patent applications filed for devices which may be related to the present invention include U.S. Patent Application 2001/0002541 filed by Patel et al.; U.S. Patent Application 2002/0050144 filed by Patel et al.; and U.S. Patent Application 2001/0050164 filed by Wagner et al.

While these devices may be suitable for the particular purpose to which they address, they are not as suitable for providing an effective thermal management system capable of maintaining a desired semiconductor temperature during a burn-in cycle. Conventional semiconductor burn-in thermal management systems are inaccurate and inefficient thereby increasing the testing costs for a semiconductor manufacturer.

In these respects, the semiconductor burn-in thermal management system according to the present invention substantially departs from the conventional concepts and designs of the prior art, and in so doing provides an apparatus primarily developed for the purpose of providing an effective thermal management system capable of maintaining a desired semiconductor temperature during a burn-in cycle.

BRIEF SUMMARY OF THE INVENTION

In view of the foregoing disadvantages inherent in the known types of semiconductor burn-in systems now present in the prior art, the present invention provides a new semiconductor burn-in thermal management system construction wherein the same can be utilized for providing an effective thermal management system capable of maintaining a desired semiconductor temperature during a burn-in cycle.

The general purpose of the present invention, which will be described subsequently in greater detail, is to provide a new semiconductor burn-in thermal management system that has many of the advantages of the semiconductor burn-in systems mentioned heretofore and many novel features that result in a new semiconductor burn-in thermal management system which is not anticipated, rendered obvious, suggested, or even implied by any of the prior art semiconductor burn-in systems, either alone or in any combination thereof.

To attain this, the present invention generally comprises a reservoir for storing a volume of fluid, a pump fluidly connected to the reservoir, and a plurality of spray units fluidly connected to the pump. The spray units dispense the fluid upon the surface of the semiconductors during burn-in thereby maintaining relatively constant surface temperatures (coolant delivered to each chip may be modulated as a function of the temperature of the chip). In the present embodiment of the invention, each of the spray units includes a stationary first portion with a second portion movably positioned within the first portion in a biased manner. However, it can be appreciated that it is not necessary for the second portion to be movable relative to the first portion. When burning in semiconductors without an integrated heat sink that are deeply recessed within the sockets of a burn-in board, the fluid pressure to the second portion is increased thereby extending the second portion from the first portion thereby reducing the effective distance from the surface of the semiconductor. The ability to adjust the distance between the outlet of a spray assembly and a chip surface also allows the thermal management system to adjust its cooling capability accordingly (increased performance when closer to the chip). Furthermore, the spray assemblies may have the capability to adjust, in real-time, the spray cone angle from each of the orifices that form part of the spray assembly, thereby providing an additional mechanism to adjust the thermal management capability. The one or more atomizers that form a part of a spray assembly may have various characteristics, shapes, sizes, styles, designs, arrangements and densities, that allow for differing spray patterns (amongst several atomizers) or spray cone angles (referring to one or more atomizers), providing additional dimensions to the thermal management system's capability.

There has thus been outlined, rather broadly, the more important features of the invention in order that the detailed description thereof may be better understood and in order that the present contribution to the art may be better appreciated. There are additional features of the invention that will be described hereinafter and that will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

A primary object of the present invention is to provide a semiconductor burn-in thermal management system that will overcome the shortcomings of the prior art devices.

A second object is to provide a semiconductor burn-in thermal management system that achieves a minimum junction temperature spread between chips burned-in simultaneously in a batch.

Another object is to provide a semiconductor burn-in thermal management system that minimizes junction temperature spread during semiconductor testing procedures.

An additional object is to provide a semiconductor burn-in thermal management system that is energy efficient, flexible and relatively small in size.

A further object is to provide a semiconductor burn-in thermal management system that is less costly to implement and operate than conventional thermal management systems.

Another object is to provide a semiconductor burn-in thermal management system that reduces testing times of semiconductor devices.

A further object is to provide a semiconductor burn-in thermal management system that has large heat transfer coefficients which result in increased heat flux capabilities.

Another object is to provide a semiconductor burn-in thermal management system that is capable of cooling a variety of semiconductor devices using the same burn-in equipment.

An additional object is to provide a semiconductor burn-in thermal management system that transfers heat from a semiconductor using conduction, convection, phase change or a combination thereof.

Another object is to provide a semiconductor burn-in thermal management system that works with existing and various types of burn-in equipment currently utilized in the industry.

A further object is to provide a semiconductor burn-in thermal management system that mitigates vapor and coolant losses.

Another object is to provide a semiconductor burn-in thermal management system that is capable of managing the temperature of semiconductors that utilize an integrated heat sink and semiconductors that do not utilize an integrated heat sink.

Other objects and advantages of the present invention will become obvious to the reader and it is intended that these objects and advantages are within the scope of the present invention.

To the accomplishment of the above and related objects, this invention may be embodied in the form illustrated in the accompanying drawings, attention being called to the fact, however, that the drawings are illustrative only, and that changes may be made in the specific construction illustrated and described within the scope of the appended claims.

BRIEF DESCRIPTION OF THE DRAWINGS

Various other objects, features and attendant advantages of the present invention will become fully appreciated as the same becomes better understood when considered in conjunction with the accompanying drawings, in which like reference characters designate the same or similar parts throughout the several views, and wherein.

DETAILED DESCRIPTION OF THE INVENTION

A. Overview

Figure 1:
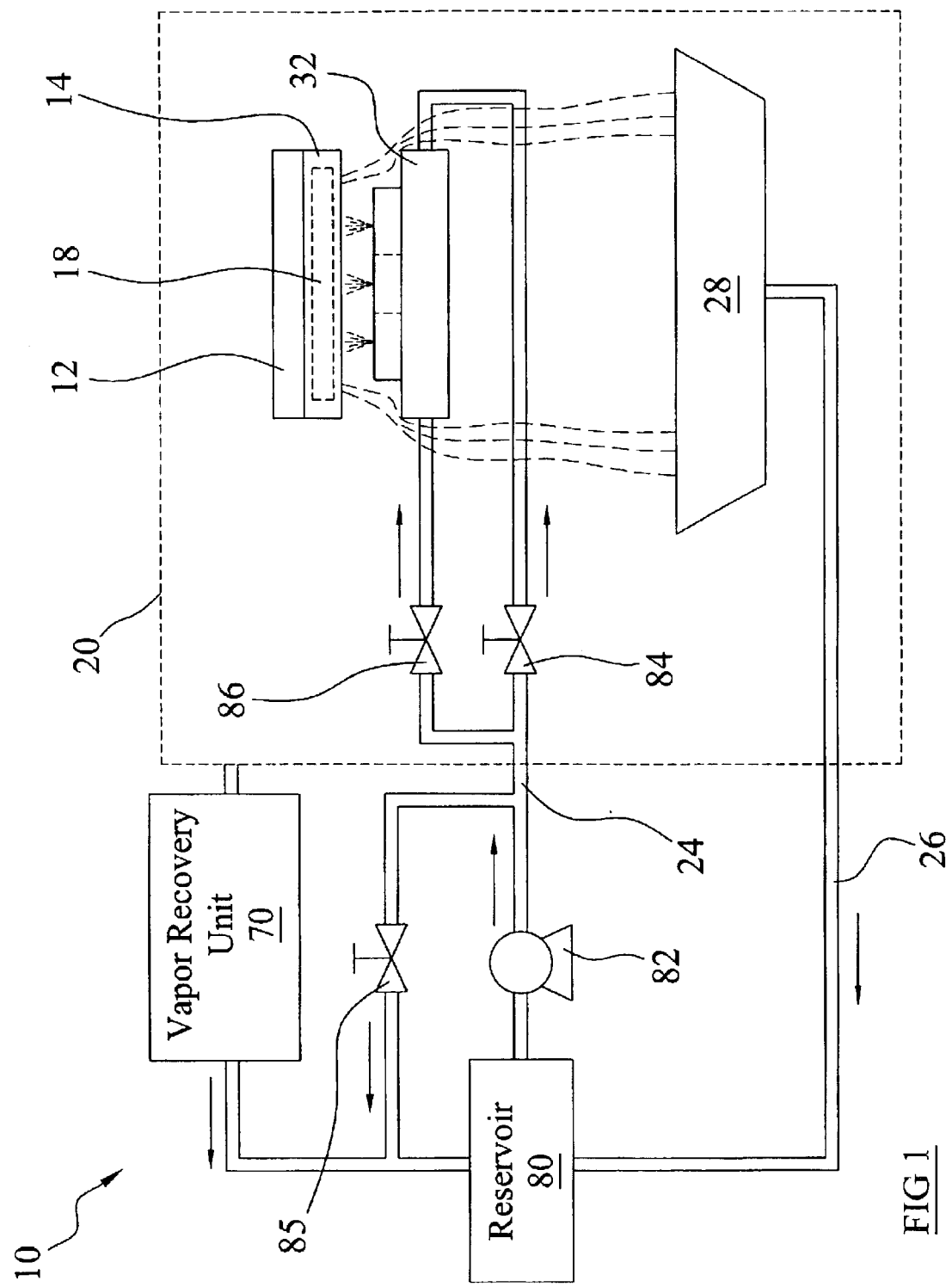
FIG. 1 is a schematic diagram illustrating the overall structure of the present invention.
Figure 2:
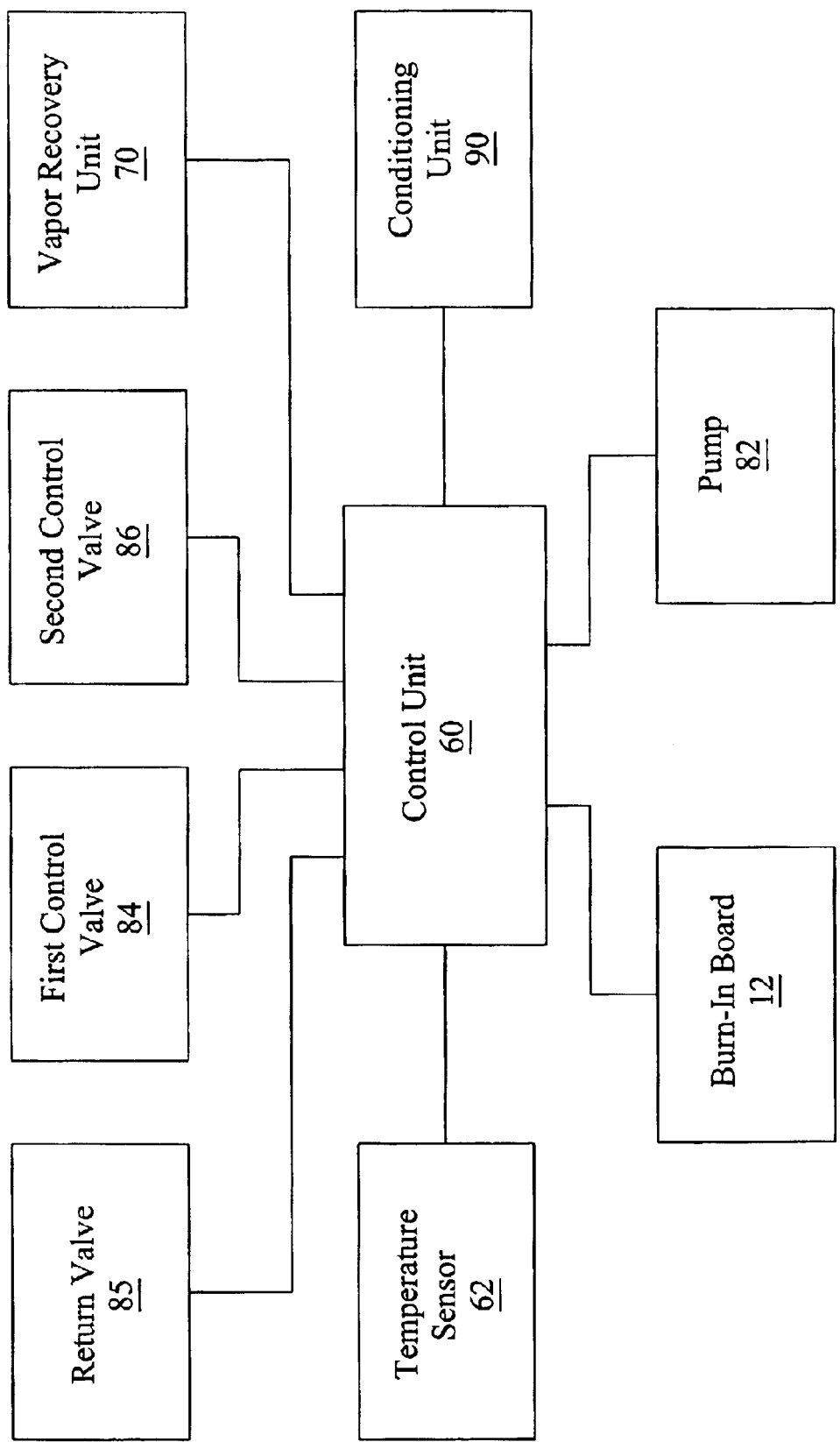
FIG. 2 is a block diagram illustrating the communication connections between the control unit and the related components of the present invention.

Turning now descriptively to the drawings, in which similar reference characters denote similar elements throughout the several views, FIGS. 1 through 18 illustrate a semiconductor burn-in thermal management system 10, which comprises a reservoir 80 for storing a volume of fluid, a main pump 82 fluidly connected to the reservoir 80, and a plurality of spray units 40 fluidly connected to the main pump 82. The spray units 40 dispense the fluid upon the surface of the semiconductor 18 during burn-in thereby maintaining a relatively constant surface temperature. In the present embodiment of the invention, each of the spray units 40 includes a stationary first portion 50 with a second portion 54 movably positioned within the first portion 50 in a biased manner. When burning in semiconductors 18 without an integrated heat sink that are deeply recessed within the sockets 14 of a burn-in board 12, the fluid pressure to the second portion 54 is increased thereby extending the second portion 54 from the first portion 50 thereby reducing the effective distance from the surface of the semiconductor 18.

The invention described herein relates to a stand-alone burn-in system. In other words, the thermal management system, the burn-in boards and chips, and the control system are all packaged into a stand-alone piece of equipment. However, it can be appreciated that the present invention may be embodied in an alternative form that can be described as having a central pump/control station that services multiple satellite burn-in stations serviced by a central reservoir 80, as well as a common fluid distribution system.

B. Spray Enclosure

Figure 4:
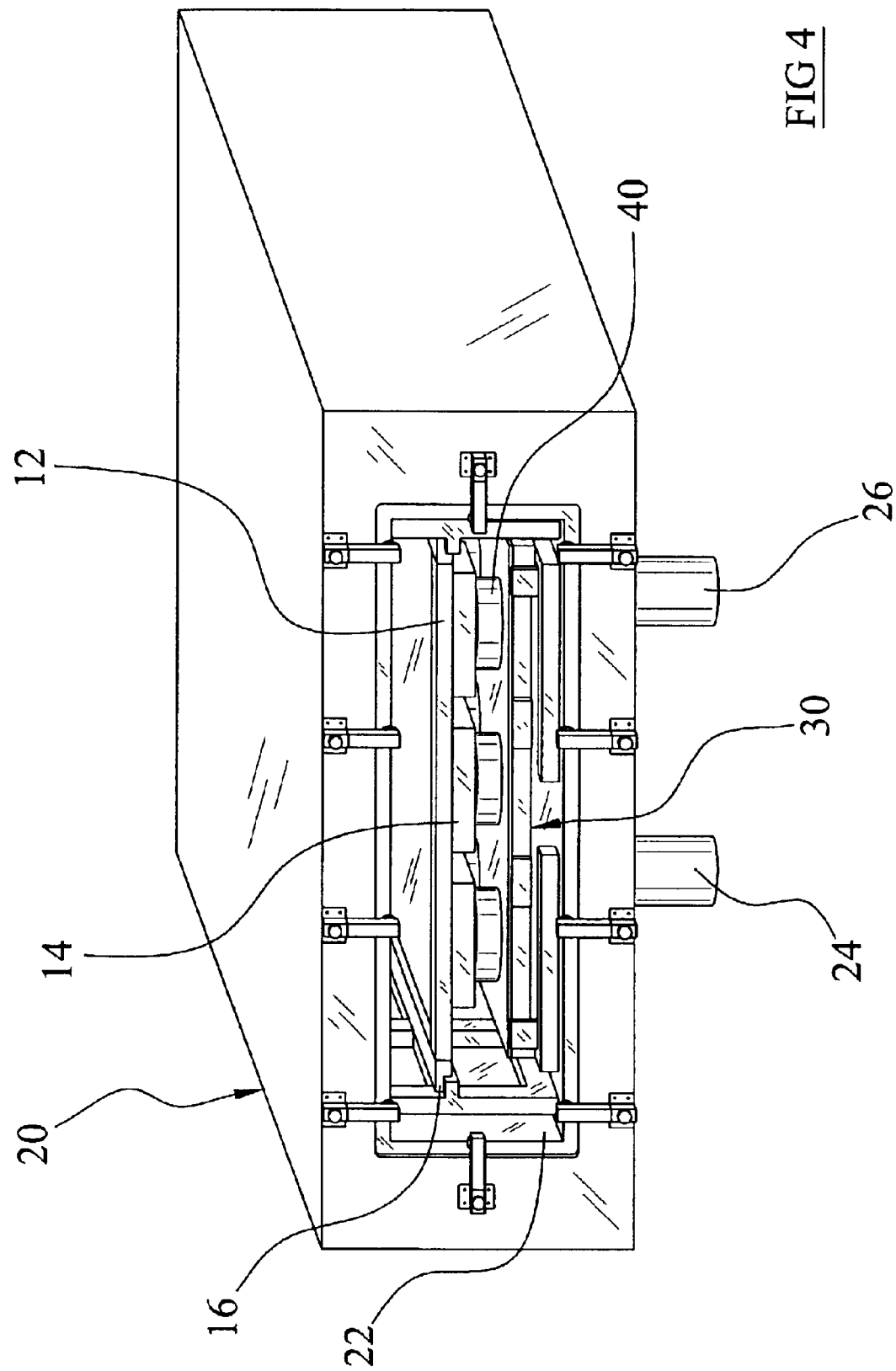
FIG. 4 is an upper perspective view of an exemplary spray enclosure with a burn-in board positioned within.
Figure 5:
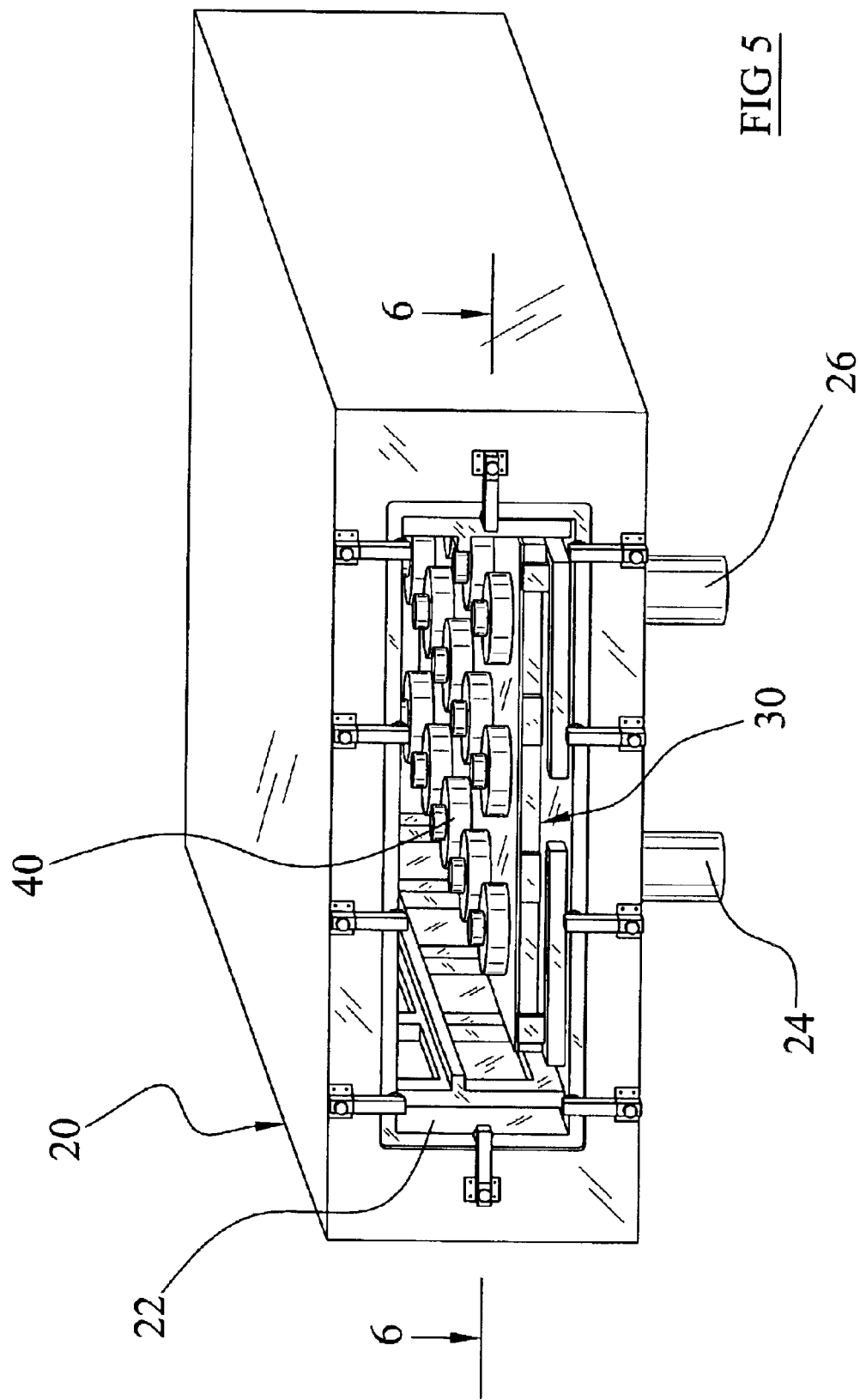
FIG. 5 is an upper perspective view of the exemplary spray enclosure with the burn-in board removed illustrating the spray assembly within the spray enclosure.
Figure 6:
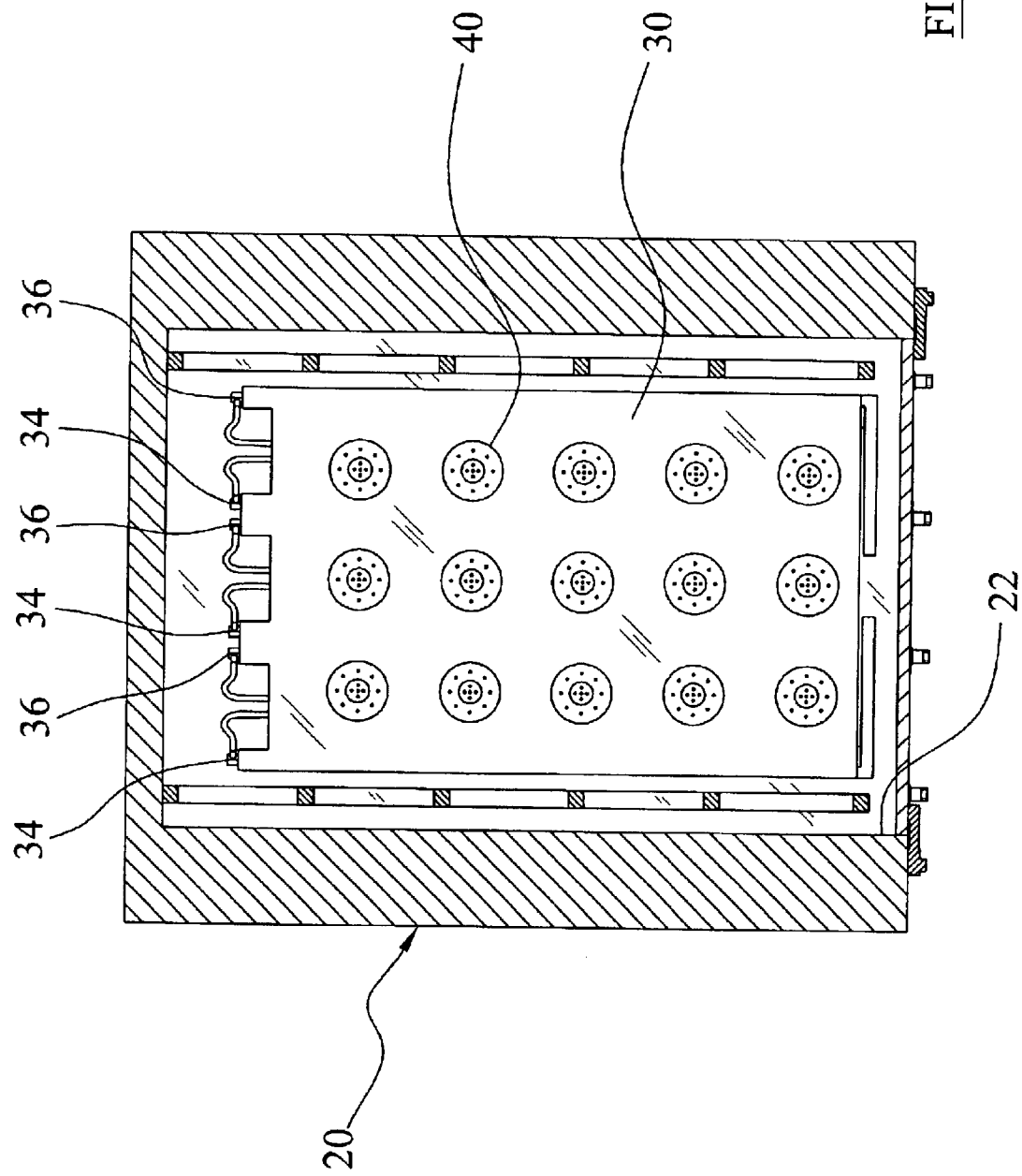
FIG. 6 is a cross sectional view taken along line 6—6 of FIG. 5 illustrating the spray assembly within the exemplary spray enclosure.

FIGS. 4 through 6 illustrate an exemplary spray enclosure 20 having an interior cavity 22 for receiving at least one burn-in board 12. The spray enclosure 20 may be comprised of any structure capable of housing a burn-in board which are commonly utilized within the burn-in industry or other unit not utilized within the burn-in industry. The spray enclosure 20 preferably has an opening and a door for selectively closing and sealing the opening as is conventional with spray enclosures 20 utilized within the burn-in industry. The spray enclosure 20 preferably has a rail structure 16 or other structure for receiving and supporting one or more burn-in boards 12 in a desired position with respect to the corresponding spray assembly 30. It can be appreciated that the spray units 30 and the burn-in boards 12 may be stacked within the interior cavity 22 of the spray enclosure 20 depending upon the total number of burn-in boards 12 to be utilized simultaneously. The present invention may also be configured to receive a self-contained rack unit containing a plurality of arrays of spray assemblies 30 for allowing quick changing of the semiconductors thereby increasing the operational time of the burn-in system.

It can be appreciated that the spray enclosure 20 may have various structures and configurations not illustrated within FIGS. 4 through 6 of the drawings that may be suitable for usage with the present invention. U.S. Pat. No. 5,880,592 provides an exemplary burn-in spray enclosure 20.

As shown in FIGS. 4 and 5 of the drawings, an inlet tube 24 extends into the spray enclosure 20 for providing the fluid to the spray assembly 30 as will be discussed in further detail. As further shown in FIGS. 4 and 5 of the drawings, an outlet tube 26 extends from the spray enclosure 20 returning the fluid recovered from the spray enclosure 20 to the reservoir 80.

C. Burn-In Board

Figure 9:
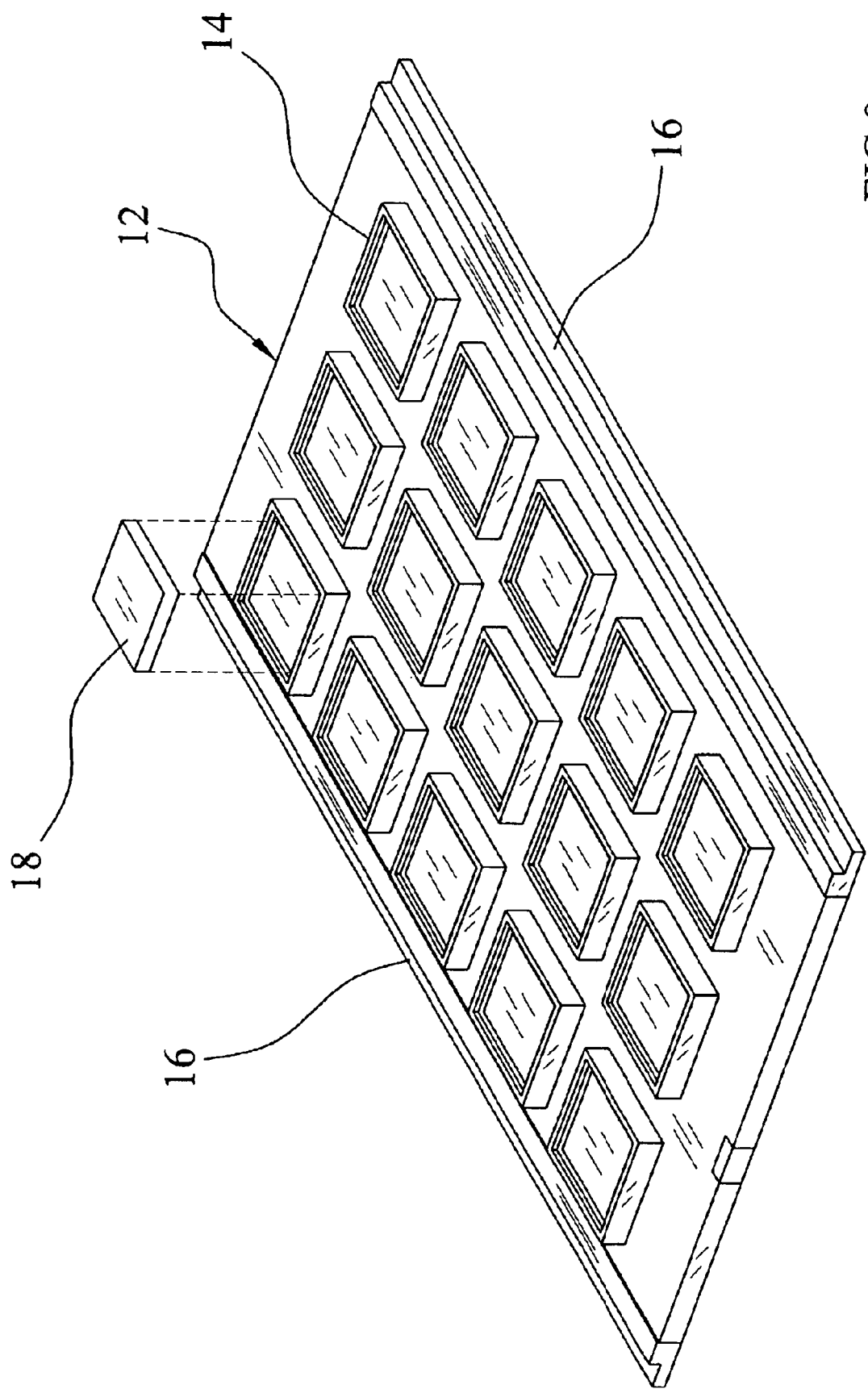
FIG. 9 is an upper perspective view of an exemplary burn-board.

The present invention may utilize various structures and types of burn-in boards 12 that are commonly utilized within the burn-in industry. The burn-in board 12 includes one or more sockets 14 arranged in a desired pattern as shown in FIG. 9 of the drawings. Each of the sockets 14 removably receives, through an opening, a semiconductor 18 to be tested during the burn-in phase. The fluid is sprayed from the spay nozzles through this opening to engage a surface of the semiconductor 18 contained within the sockets 14 for maintaining the desired temperature of the semiconductors 18 within.

The sockets 14 are electrically connectable to the semiconductor 18 inserted within the respective sockets 14. The burn-in board 12 is then electrically coupled to a control unit 60 via a communications port or other structure attached to the burn-in board 12 that controls the test signals sent to each of the semiconductors 18 during the burn-in testing procedure. U.S. Pat. Nos. 6,404,219, 6,181,146 and 5,825,171 illustrate exemplary burn-in devices and burn-in systems which are suitable for usage with the present invention. It can be appreciated that various other burn-in board 12 structures and configurations may be utilized with the present invention.

In addition, a temperature sensor 62 may be attached to each of the sockets 14, directly upon the semiconductors 18 for measuring the temperature of the semiconductors 18 during testing, or may come embedded directly within the chips. Devices for measuring the temperature of semiconductors 18 are commonly utilized within the burn-in industry that may be utilized with the present invention. Examples of suitable temperature sensors 62 include but are not limited to thermocouple, thermopile, electronic devices capable of inferring temperature of the semiconductor 18 from the semiconductor's power draw, or infrared devices.

D. Spray Assembly

Figure 7:
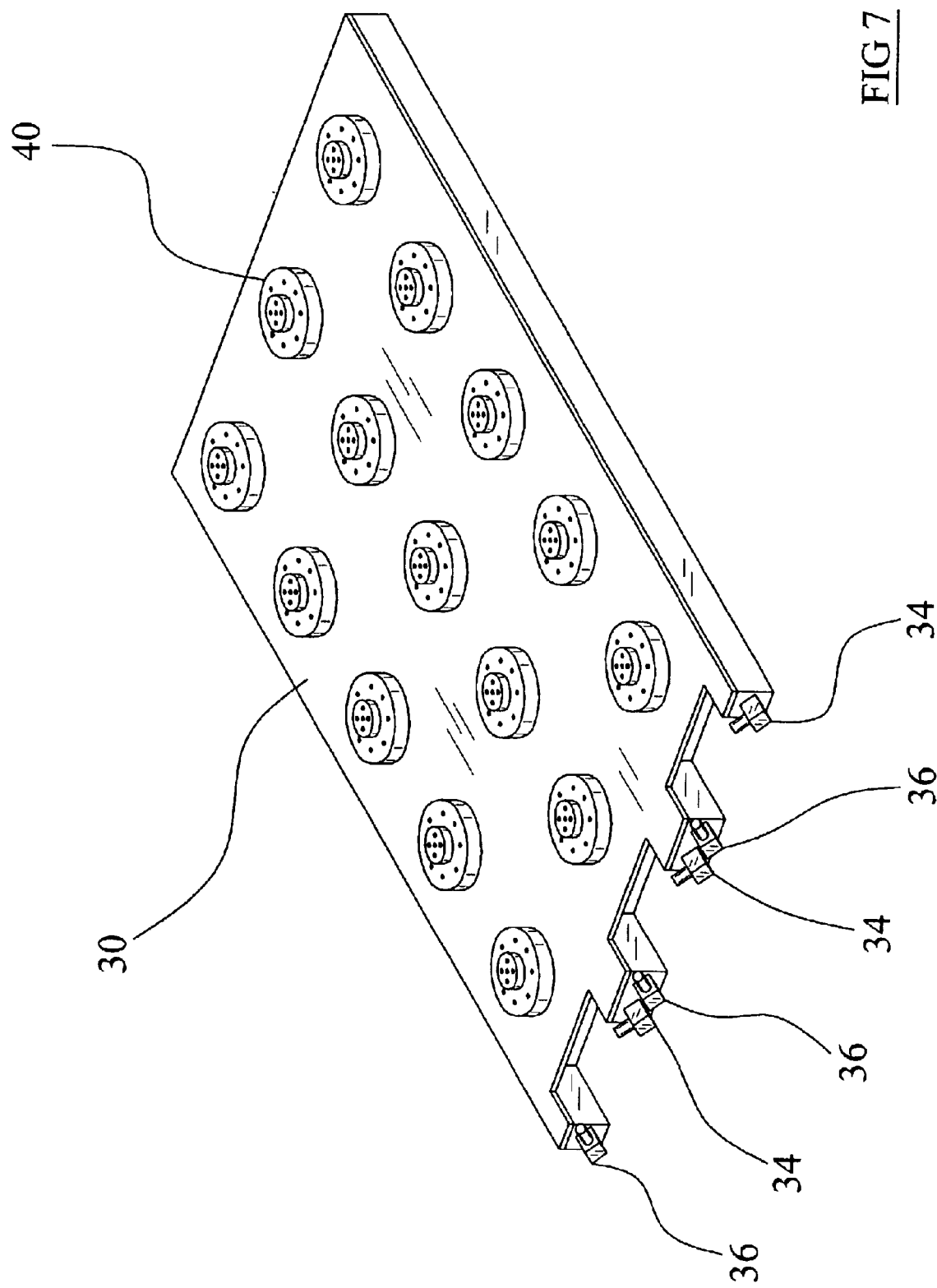
FIG. 7 is an upper perspective view of the upper portion of the spray assembly.
Figure 8:
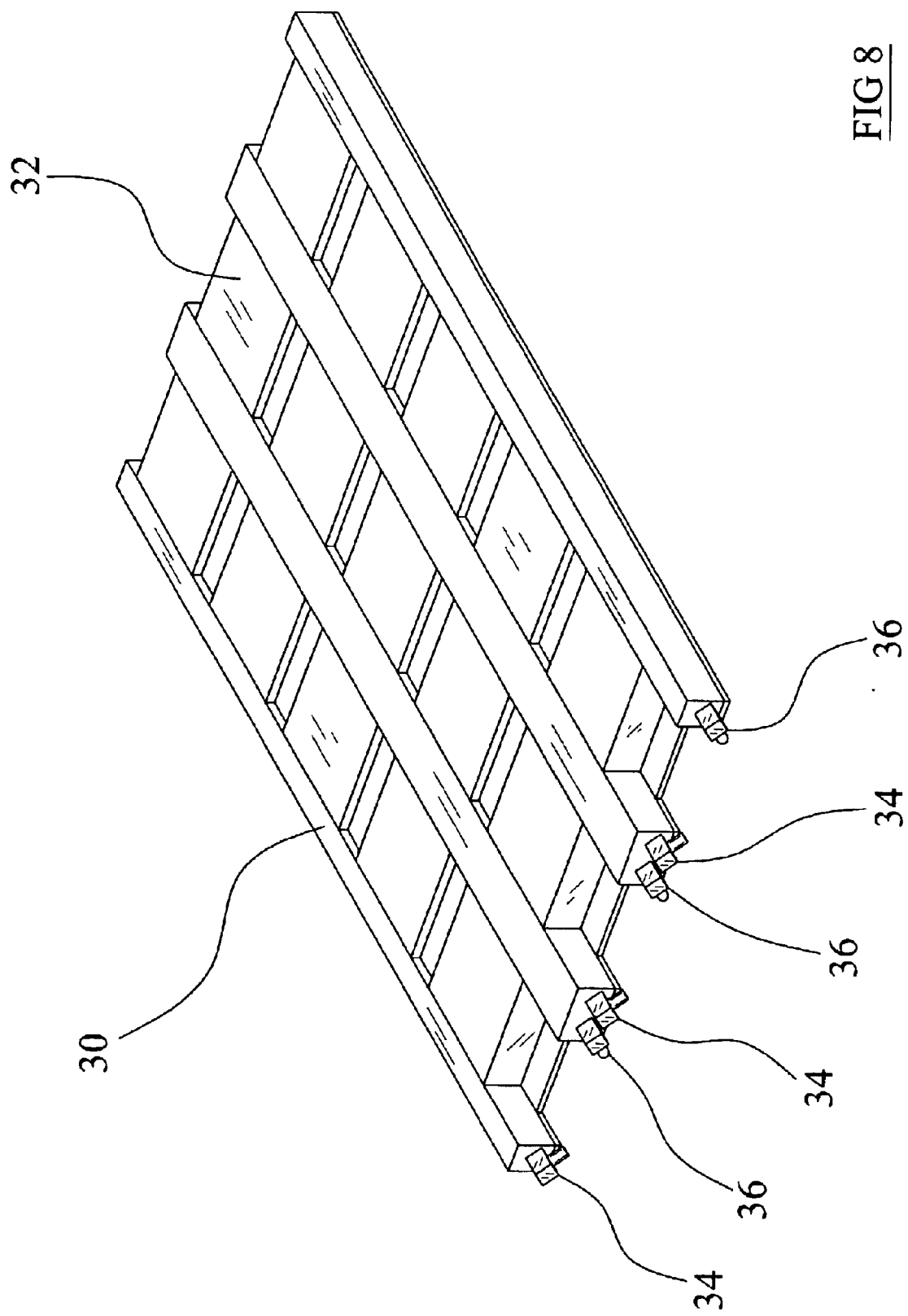
FIG. 8 is an upper perspective view of the lower portion of the spray assembly.

The spray assembly 30 has a housing containing of one or more spray units 40 as illustrated in FIGS. 7 and 8 of the drawings. The spray assembly 30 preferably is comprised of a relatively flat structure, however various other structures may be utilized to construct the spray assembly 30.

Each of the spray units 40 is arranged upon the spray assembly 30 corresponding to a specific socket 14 within the burn-in board 12. There may or may not be a pattern for the plurality of spray units 40 such as but not limited to a row pattern as illustrated in FIGS. 6 and 7, or a staggered pattern.

Each of the spray units 40 includes a housing structure 42 having an interior housing cavity 43 covered by a rear plate 44 as shown in FIGS. 10 through 17 of the drawings. The rear plate 44 may be attached to the housing structure 42 using various fastening devices. The housing structure 42 may have various sizes and shapes other than illustrated in the drawings. A first port 45 and a second port 46 are fluidly connected within the housing structure 42 which fluidly correspond to the first portion 50 and the second portion 54 of the spray units 40 respectively.

Figure 10:
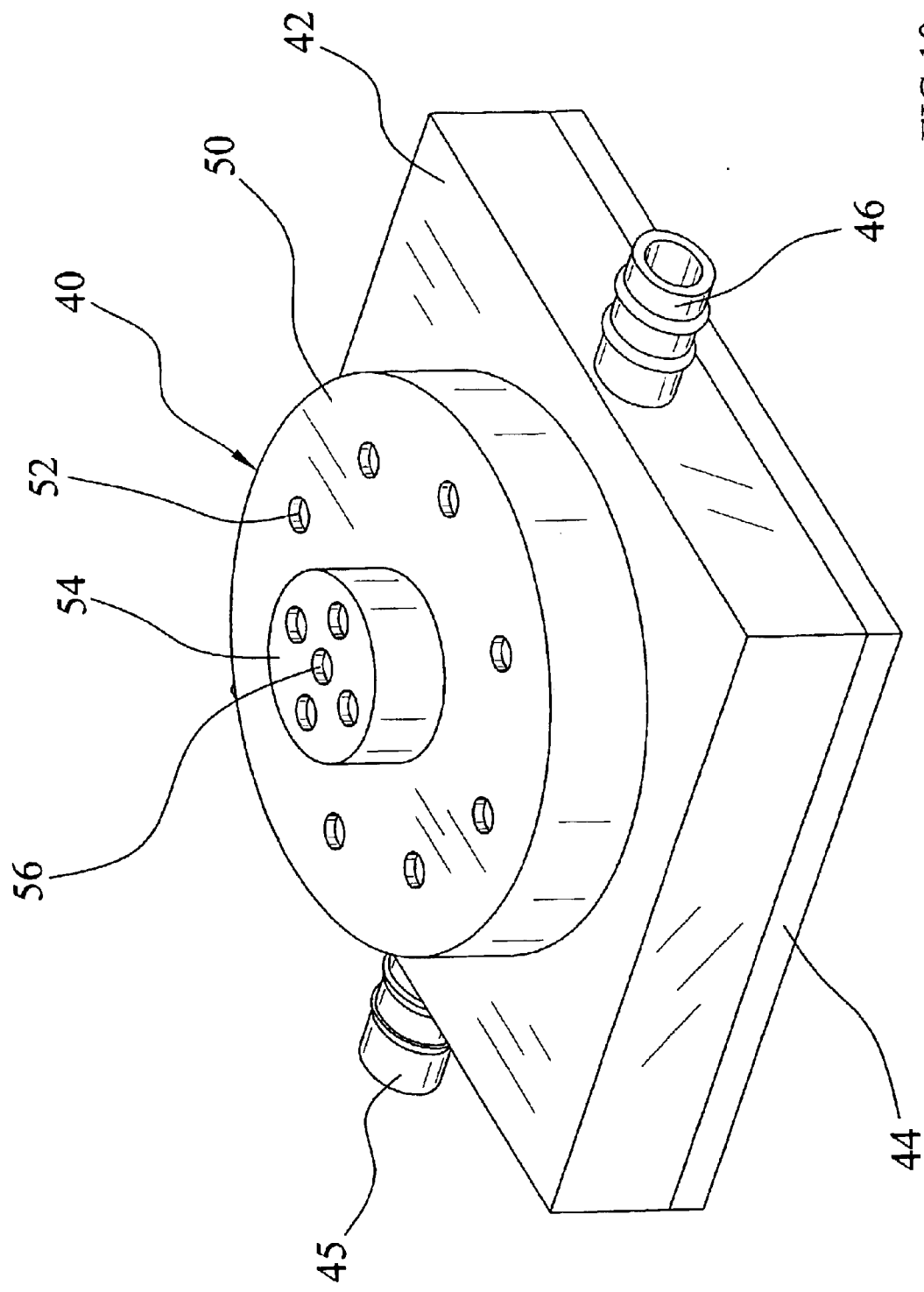
FIG. 10 is an upper perspective view of a spray assembly.
Figure 11:
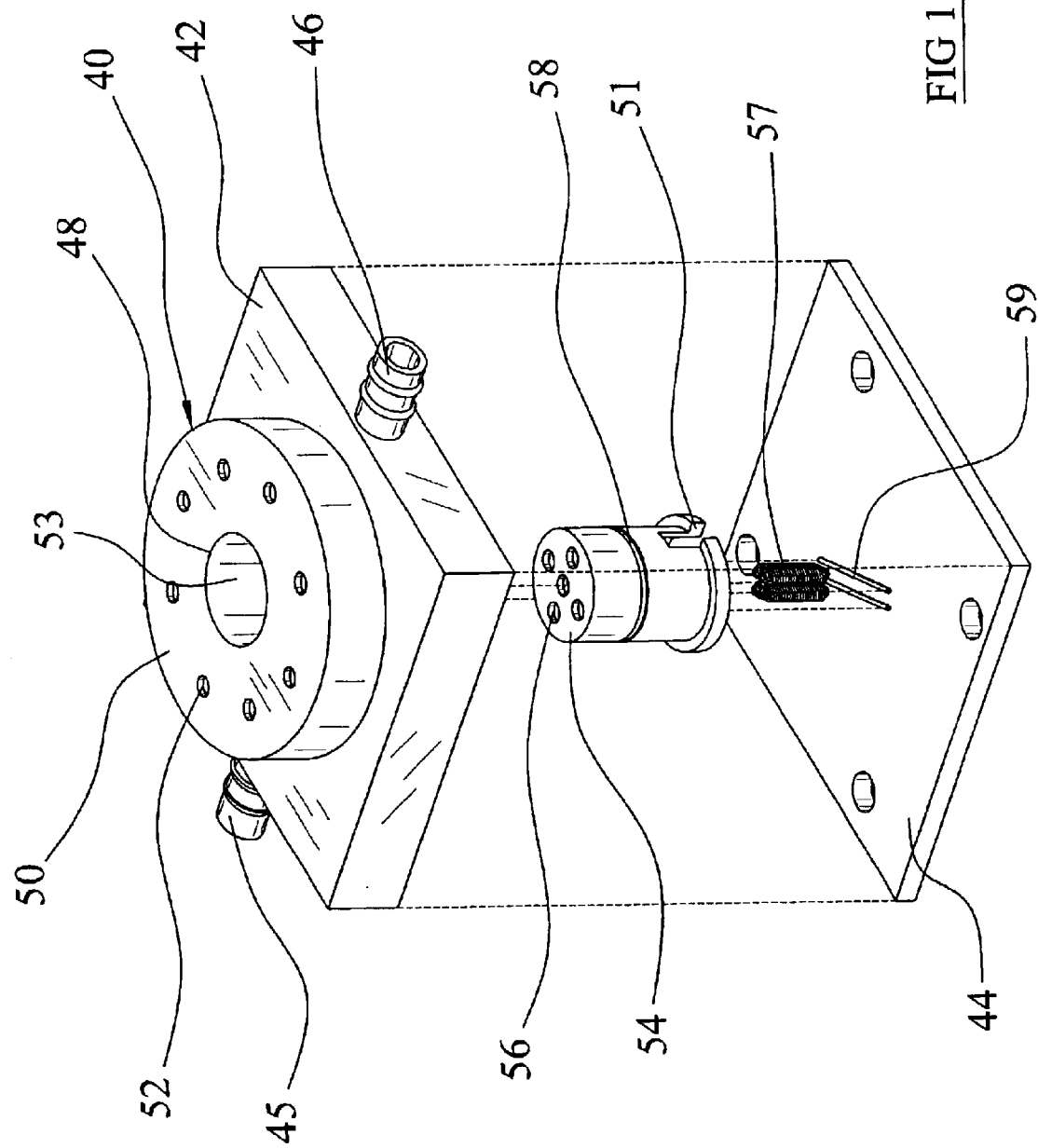
FIG. 11 is an exploded upper perspective view of the spray assembly.
Figure 12:
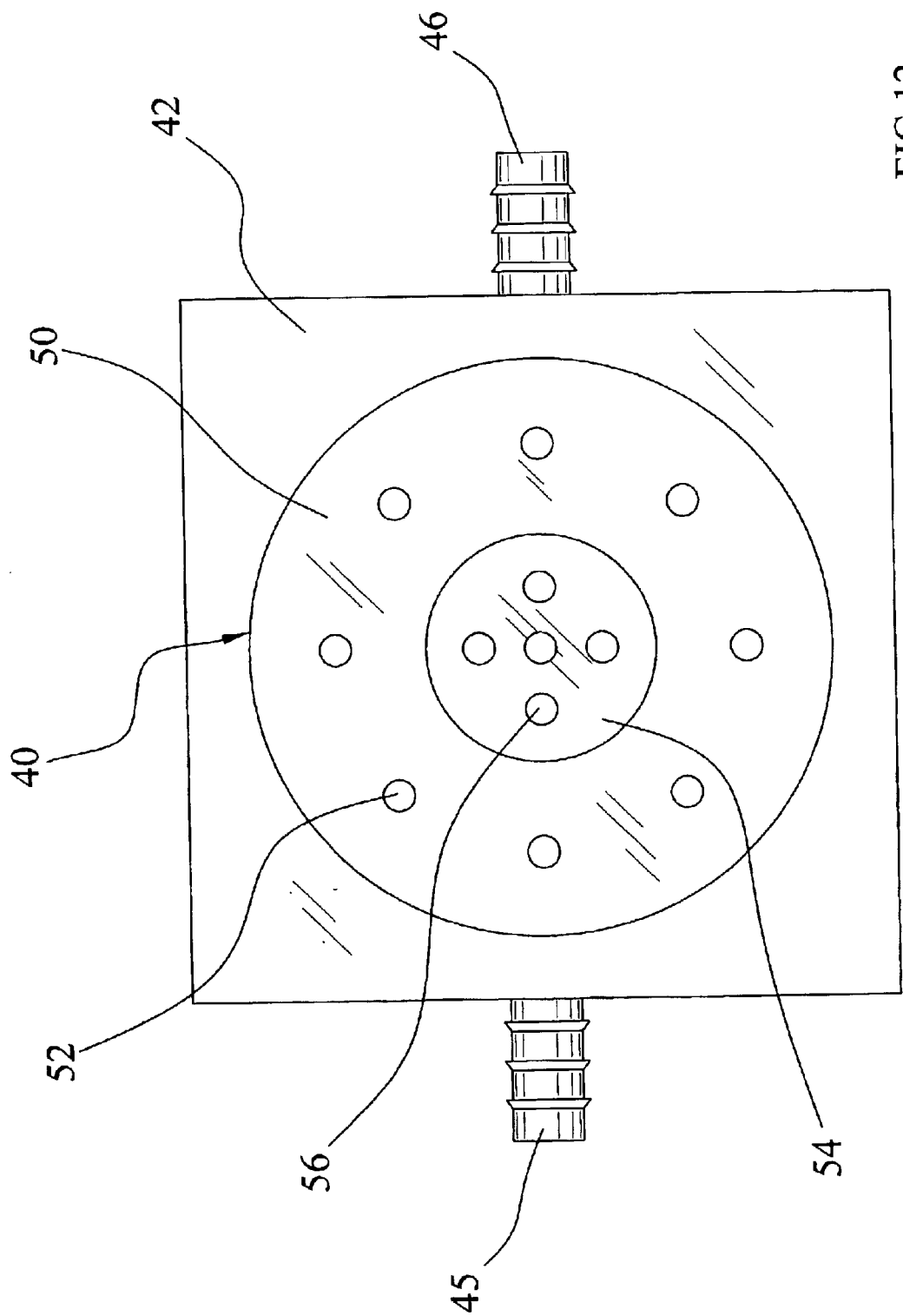
FIG. 12 is a top view of the spray assembly.

As shown in FIGS. 10 through 17 of the drawings and for the present embodiment of the invention, each of the spray units 40 has a first portion 50 and a second portion 54 movably positioned within the first portion 50, though a simpler non-movable nozzle structure may also be utilized with the present invention. FIGS. 10 and 11 illustrate the usage of a circular structure with a partially enclosed upper end. However, the first portion 50 may have various shapes and structures for dispensing the fluid onto the semiconductor 18.

The first portion 50 entirely or partially surrounds the second portion 54 as best illustrated in FIG. 10 of the drawings. One or more first orifices 52 extend within the first portion 50 in various patterns. The first orifices 52 may have various characteristics, shapes, sizes, styles, designs, arrangements and densities. The first orifices 52 may be arranged to provide various spray patterns amongst multiple orifices, or various cone angles from each individual orifice, upon the semiconductor 18. Cone angles may be of the full cone variety as is known in the art, or of the hollow cone variety as is also known in the art, and may vary from 10° to 60°, but are not limited to varieties, or this angular range. It is desirable to utilize first orifices 52 that provide an adjustable spray pattern depending upon the heat flux of the semiconductor 18 being tested. The first orifices 52 dispense the pressurized fluid from within the housing cavity 43 as shown in FIG. 16 of the drawings.

As shown in FIG. 11 of the drawings, a main opening 48 extends into the first portion 50. The main opening 48 has a shape and size similar to the second portion 54 such as but not limited to circular, square, oval, rectangular and the like. The main opening 48 is sufficient in size to allow for the sliding movement of the second portion 54 within the main opening 48.

Figure 13:
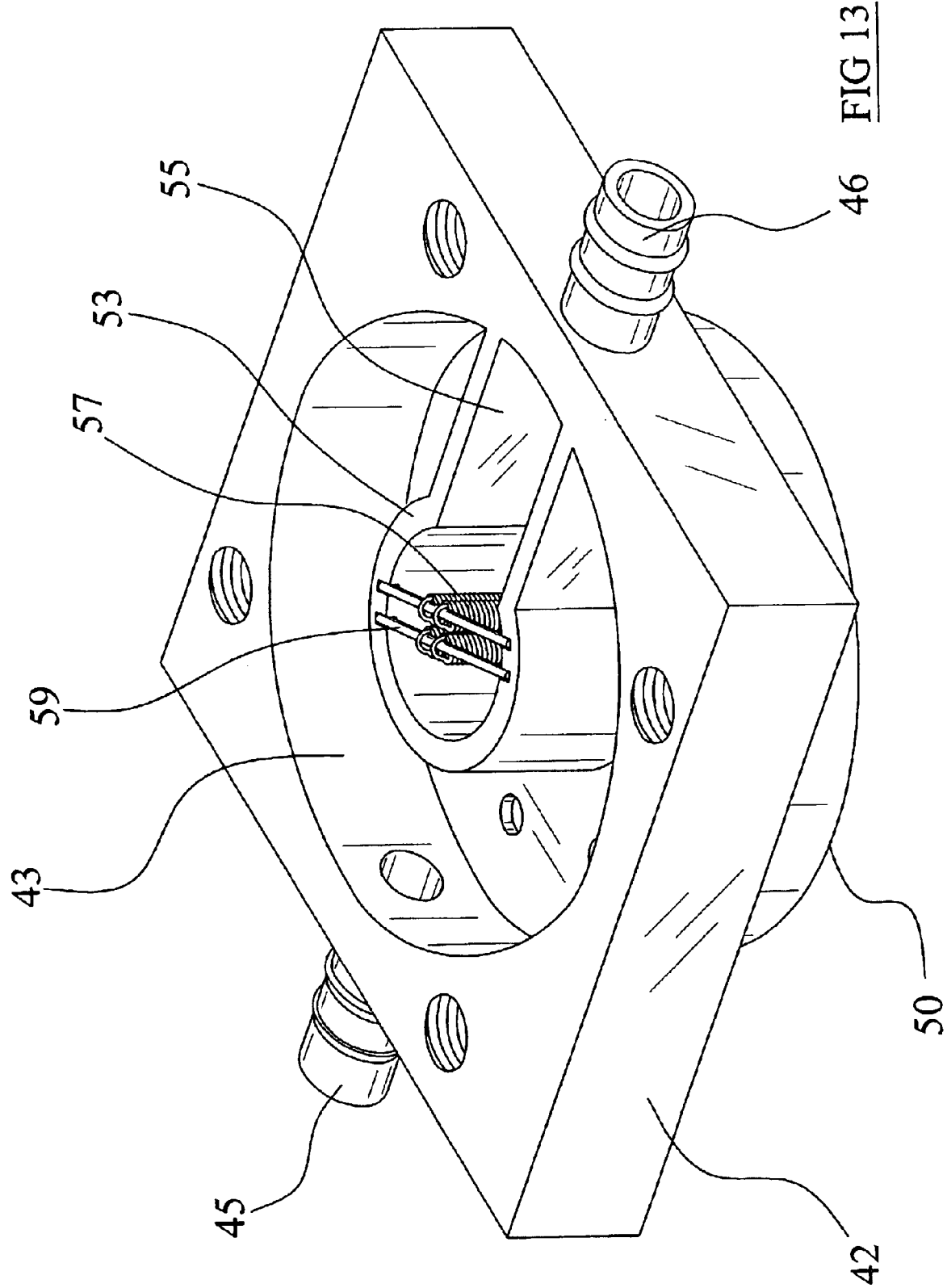
FIG. 13 is an upper perspective view of the spray assembly inverted with the rear plate removed.
Figure 14:
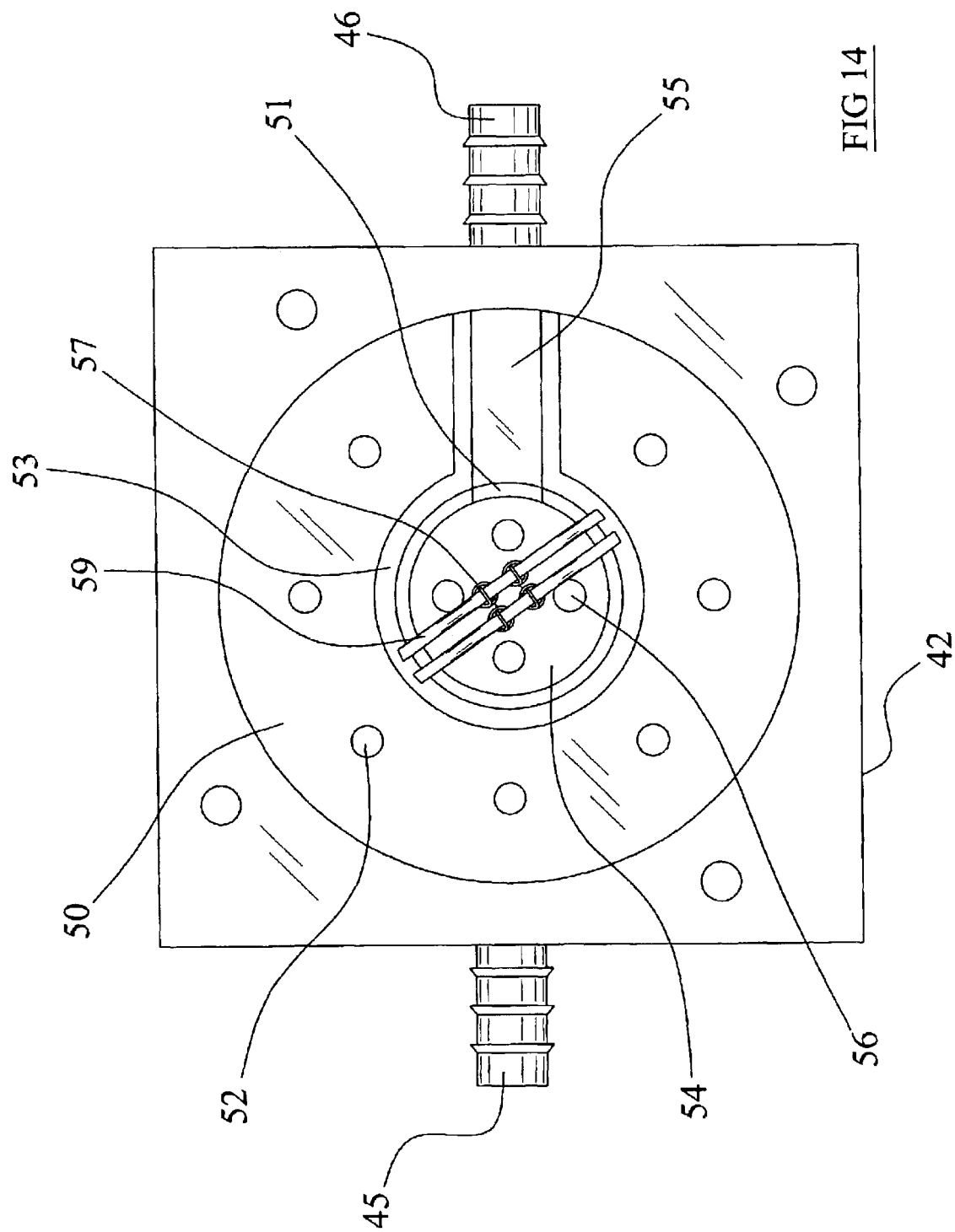
FIG. 14 is a bottom view of the spray assembly with the rear plate removed.
Figure 15:
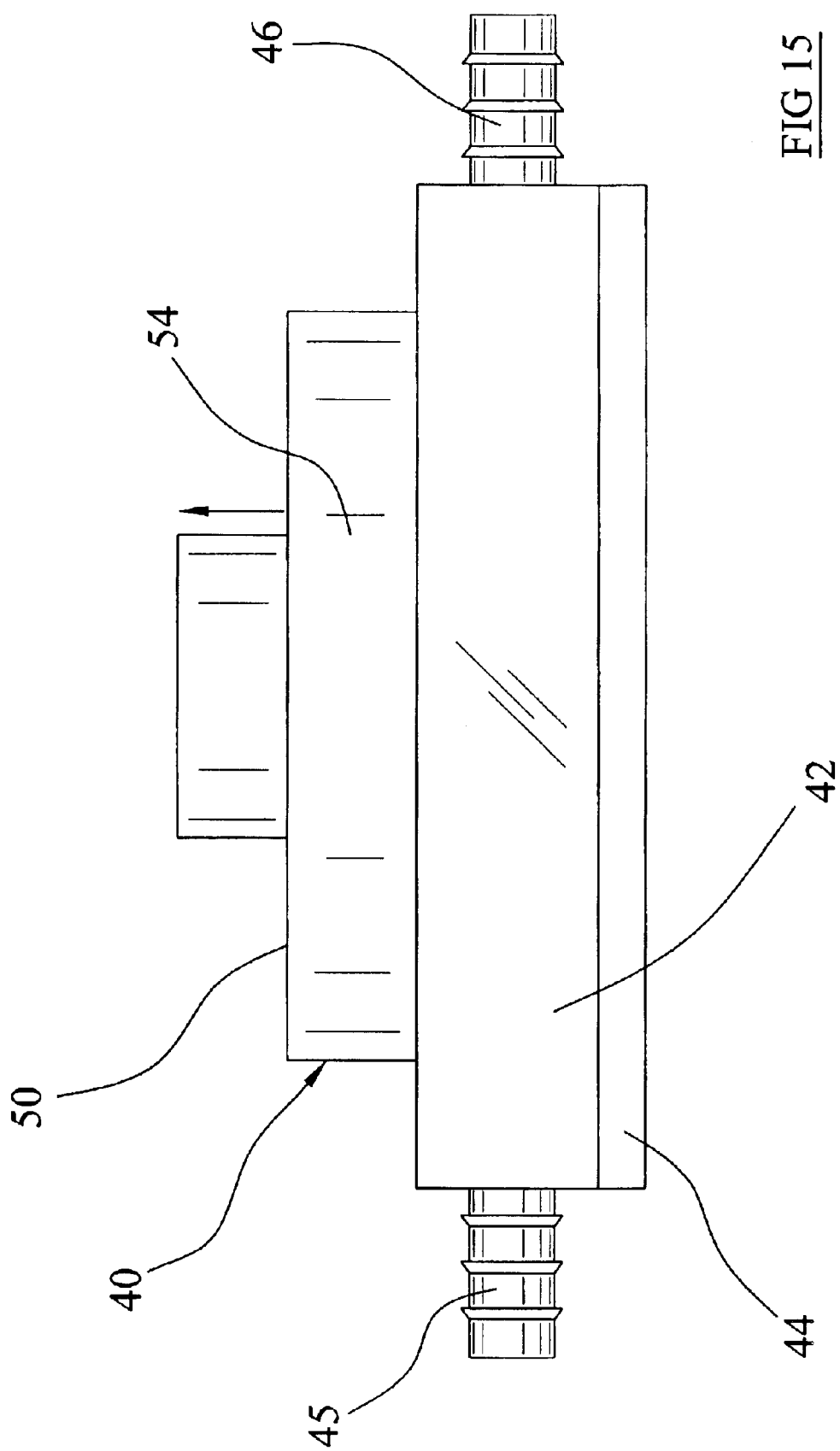
FIG. 15 is a side view of the spray assembly illustrating the movement of the second portion within the first portion.
Figure 16:
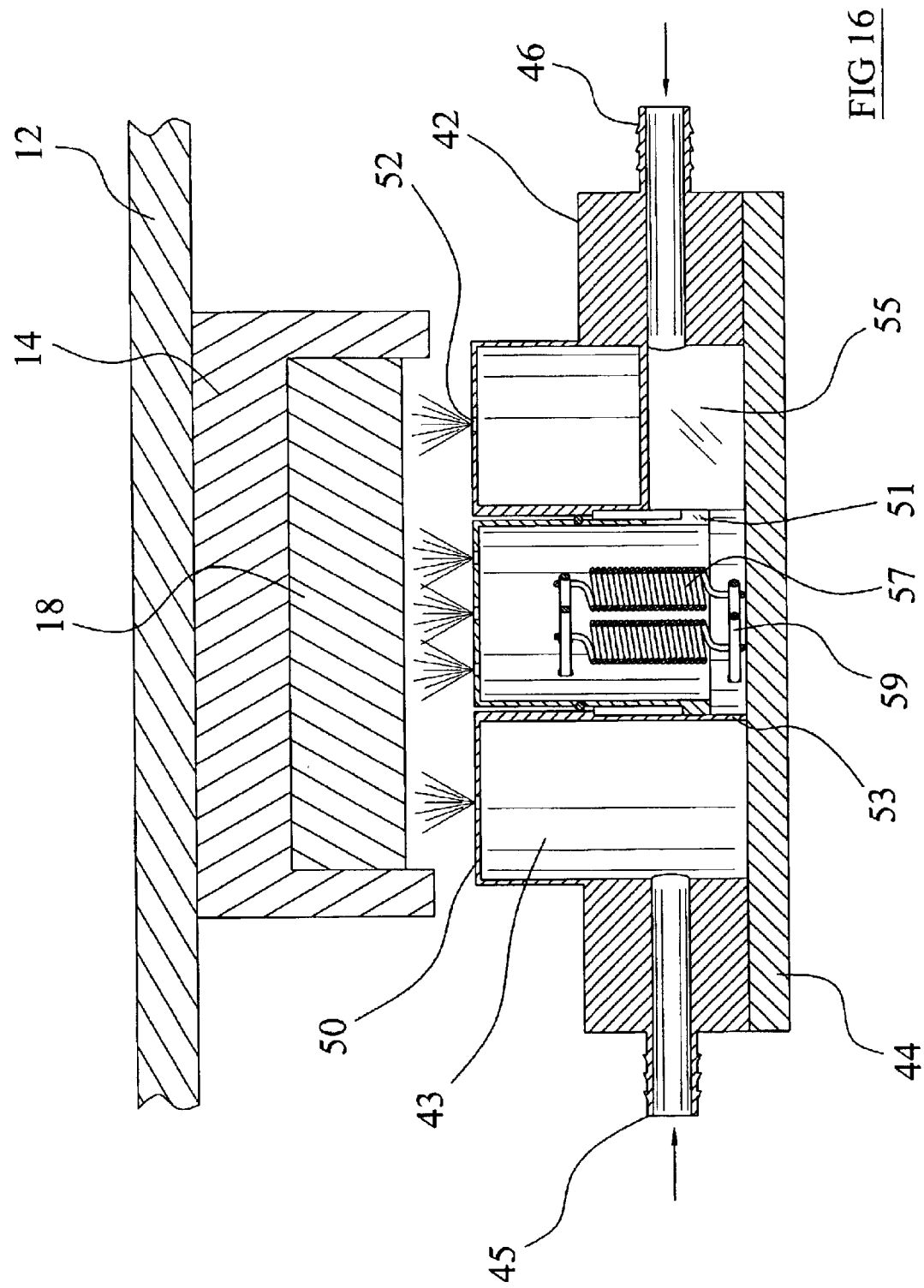
FIG. 16 is a side cutaway view of the spray assembly dispensing fluid upwardly upon the semiconductor having a higher profile (e.g. containing an integrated heat sink) within a socket of the burn-in board.
Figure 17:
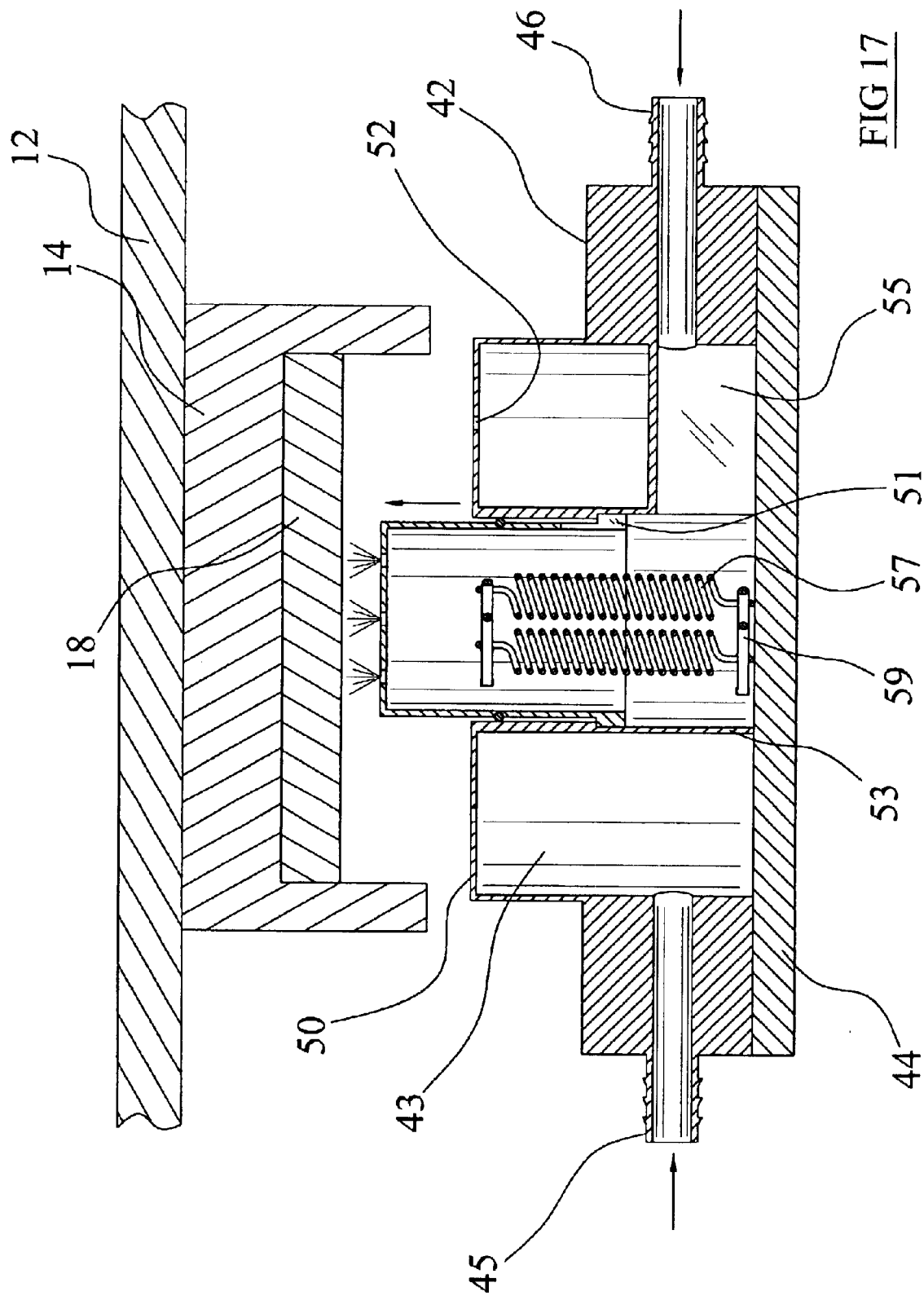
FIG. 17 is a side cutaway view of the spray assembly dispensing fluid upwardly upon the semiconductor having a lower profile (e.g. no integrated heat sink) within a socket of the burn-in board with the second portion fully extended from the first portion.

As shown in FIGS. 14, 16 and 17 of the drawings, a tubular portion 53 extends downwardly from an interior surface of the upper end of the first portion 50. The tubular portion 53 preferably surrounds the main opening 48 within the first portion 50 and extends downwardly a finite distance for slidably receiving the second portion 54. A channel 55 fluidly extends from the second port 46 to the tubular portion 53 in a sealed manner to provide pressurized fluid to the second portion 54 independently of the first portion 50 as best illustrated in FIG. 13 of the drawings. It can be appreciated that a single channel may feed both the first portion 50 and the second portion 54.

As shown in FIG. 11 of the drawings, the second portion 54 is comprised of a tubular structure with one or more second orifices 56 within the upper end thereof. The second orifices 56 may have various characteristics, shapes, sizes, styles, designs, arrangements, patterns and densities. The second portion 54 is formed to slidably extend within the main opening 48 and the tubular portion 53 as best illustrated in FIGS. 16 and 17 of the drawings. At least one seal member 58 is positioned within the second portion 54 for sealing the second portion 54 within the tubular portion 53 as best illustrated in FIG. 11 of the drawings. A longitudinal cutout 51 preferably extends into the lower end of the first portion 50 which movably fits about the channel 55 thereby allowing entry of the fluid from the channel 55 into the second portion 54.

For a given cone type (full cone or hollow), each of the first orifices 52 and second orifices 56 may have static spray cone angles or dynamic spray cone angles. Dynamic spray cone angles may be utilized dependent upon changing thermal management requirements for the semiconductor 18. For example, if it is desirable to reduce the cooling of the semiconductor 18, one or more of the orifices 52, 56 may be adjusted to reduce the surface area that is sprayed with the fluid by adjusting the spray cone angles in response to temperature feedback. Conversely, if it is desirable to increase the cooling of the semiconductor 18, one or more of the orifices 52, 56 may be adjusted to increase the surface area that is sprayed with the fluid by adjusting the spray cone angles in response to temperature feedback.

The second portion 54 is downwardly biased within the tubular portion 53 by a biasing device which may be comprised of various biasing structures such as but not limited to springs 57. The biasing device is preferably comprised of one or more springs 57 attached between the tubular portion 53 and the second portion 54 as illustrated in FIGS. 16 and 17 of the drawings. One or more support members 59 are attached to a lower end of the tubular portion 53 and within the second portion 54 wherein the springs 57 are connected between thereof.

When the fluid pressure within the channel 55 and the second portion 54 is increased sufficiently to overcome the biasing force of the springs 57, the second portion 54 is then extended outwardly from the first portion 50 as illustrated in FIG. 17 of the drawings. A lower flanged portion extending from the second portion 54 preferably engages a lip within the tubular portion 53 thereby preventing the second portion 54 from overextending from within the first portion 50.

When the fluid pressure within the channel 55 and the second portion 54 is not sufficient to overcome the biasing force of the springs 57, the second portion 54 is then retained downwardly within the first portion 50 with the upper ends of the first portion 50 and the second portion 54 substantially level to one another as illustrated in FIG. 16 of the drawings. It can be appreciated that varying fluid pressure within the channel 55 and the second portion 54 will extend the second portion 54 at varying distances.

The spray assembly 30 preferably includes a first inlet port 34 that is fluidly connected to the first portion 50 of the spray units 40 and a second inlet port 36 that is fluidly connected to the second portion 54 of the spray units 40. A first valve 84 preferably controls the fluid flow from the inlet tube 24 to the first inlet port 34. The first port 45 within the spray units 40 receives the fluid flow from the first inlet port 34 thereby providing the pressurized fluid to the housing cavity 43 of the spray units 40 for dispensing from the first portion 50 of the spray units 40.

A second valve 86 preferably controls the fluid flow from the inlet tube 24 to the second inlet port 36. The second port 46 within the spray units 40 receives the fluid flow from the second inlet port 36 for dispensing through the second orifices 56 within the second portion 54.

E. Dynamic Spray Control

Figure 18:
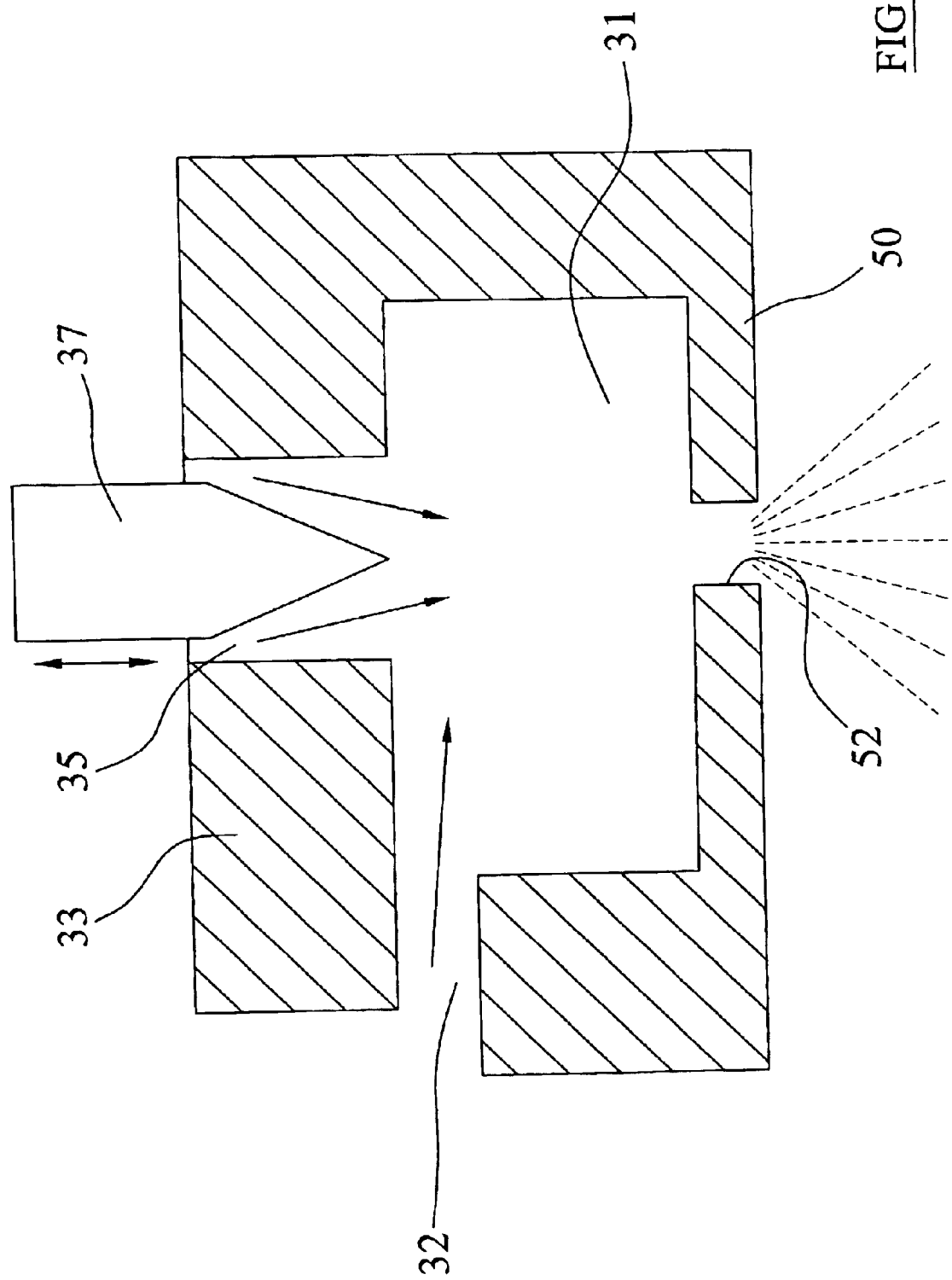
FIG. 18 is a side cutaway view of a dynamic spray control for the spray units.

FIG. 18 of the drawings illustrates an exemplary dynamic spray control for the spray units 40. The dynamic spray control may be used for one or more of the orifices 52, 56. As shown in FIG. 18, a chamber 31 is provided that is fluidly connected to the first orifice 52. One or more feed ports 32 are fluidly connected to the chamber 31 for providing a cross fluid flow into the chamber 31 with respect to the direction of spray from the first orifice 52. A center jet 35 extends within an inlet plate 33 partially surrounding the chamber 31 opposite of the first orifice 52. The inlet plate 33 may have various thickness, however it is preferably to maintain the thickness of the inlet plate 33 between 0.005–0.20 inches. A thicker inlet place 33 provides increased control over the fluid flow.

A plunger 37 is positioned within the center jet 35 that has a tapered end portion as illustrated in FIG. 18 of the drawings. The plunger 37 controls the amount of fluid that flows through the center jet 35. As the fluid flows into the chamber from the center jet 35, the fluid is combined with fluid flowing into the chamber transversely from one or more feed ports 32 creating a swirling effect within the chamber 31. As the plunger 37 is retracted from the center jet 35, an increased flow rate of the fluid is provided to the chamber 31 thereby reducing the amount of swirling of the fluid within the chamber 31 that occurs because of the feed port 32. The center jet 35 and the plunger 37 may be sized such that when the plunger 37 is fully retracted from the center jet 35, a relatively straight jet of fluid passes through the first orifice 52 instead of an atomized spray.

Various technologies may be utilized to control the position of the plunger 37 within the center jet 35 such as but not limited to digital stepper motors, linear actuators, magnetostrictive actuators or mechanical devices. In addition, each plunger 37 may be controlled individually or in a group by using a common mechanical or electrical structure by the control unit 60. The plunger 37 may be positioned within the feed port 32. In addition, the inlet plate 33 may be moved with respect to the plunger 37 in a stationary position to create a similar effect. A piezo-crystal or magnetostrictive material positioned between the inlet plate 33 and the walls of the chamber 31 may be utilized to manipulate the position of the inlet plate 33. Various other devices may be utilized to control the flow of fluid into the chamber 31 and thereby control the characteristics of the fluid spray dispersed from the first orifice 52.

F. Fluid Distribution System

The reservoir 80 is comprised of a container structure capable of retaining a desired volume of fluid. The reservoir 80 may have various shapes, sizes and structures which are commonly utilized to construct a reservoir 80. The fluid utilized within the present invention is preferably comprised of a dielectric fluid such as but not limited to hydrofluoroether (HFE). However, the fluid utilized may be comprised of a non-dielectric such as but not limited to water.

The reservoir 80 may include a thermal conditioning unit 90 for increasing or decreasing the temperature of the fluid within the reservoir 80 to a desired temperature to be sprayed upon the semiconductors 18 during the burn-in process. The thermal conditioning unit 90 may be comprised of a combination heater unit and cooling unit. A heat exchanger may be utilized to increase the temperature of the fluid within the reservoir 80 by exchanging the heat from the fluid returning from the spray enclosure 20 after spraying upon the semiconductors 18. An inline heater/cooler may also be utilized to thermally condition the fluid prior to or after spraying from the nozzles.

A main pump 82 is fluidly connected to the reservoir 80 for drawing the dielectric fluid from within the reservoir 80. The fluid pressure within the fluid distribution system may be maintained by operation of the main pump 82 and/or a return valve 85 which allows for the return of fluid to the reservoir 80 to lower the fluid pressure as shown in FIG. 1 of the drawings. Various other pressure regulating devices may be utilized to control the fluid pressure on the pressurized side of the pump. The main pump 82 is fluidly connected to the first valve 84 and the second valve 86 as further illustrated in FIG. 1 of the drawings thereby providing pressurized fluid to the spray units 40 at the desired pressure.

As shown in FIG. 1 of the drawings, a fluid collector 28 is positioned within the spray enclosure 20 for collecting the fluid after being sprayed upon the semiconductors 18. The fluid collector 28 may be comprised of various collecting devices such as but not limited to a pan structure. The fluid collector 28 is fluidly connected to the reservoir 80 for returning the used fluid to the reservoir 80. A filter device may be positioned within the fluid collector 28 or the reservoir 80 for filtering the fluid after being sprayed upon the semiconductors 18 for removing undesirable particulate materials and chemicals which might interfere with the operation of the spray units 40.

A vapor recovery unit 70 may be fluidly connected to or within the spray enclosure 20 for collecting and condensing fluid that has undergone a phase change to vapor. The vapor recovery unit 70 may be comprised of condensing coils and similar other devices capable of condensing vapor. The vapor recovery unit 70 may be utilized during and after the burn-in process.

G. Control Unit

The control unit 60 may be comprised of various electronic devices capable of communicating with and controlling the burn-in board 12, the thermal conditioning unit 90, the main pump 82, the first valve 84, the second valve 86, the return valve 85 and the vapor recovery unit 70. The control unit 60 may be comprised of a computer or other electronic device capable of receiving and storing commands.

The control unit 60 may communicate with the external electrical devices such as but not limited to electrically or via communications signal. The control unit 60 may be programmed to operate the external devices at various operating levels such as but not limited to controlling the temperature of the fluid within the reservoir 80, controlling the fluid pressure and flow rate emitted by the main pump 82, controlling the spray pattern and flow of the orifices 52, 56, and controlling the flow of fluid to the spray unit 40. It can be appreciated that more than one control unit 60 may be utilized to control one or more of the components of the present invention.

H. Operation

In use, the semiconductors 18 are properly positioned within the sockets 14 of the burn-board 12. The burn-in board 12 is then positioned within the spray enclosure 20 with the surface of the semiconductors 18 facing substantially downwardly toward the upper end of the corresponding spray units 40. The dielectric fluid within the reservoir 80 is heated to a desired temperature for cooling or heating the semiconductors 18 with or without using a conditioning unit 90. The main pump 82 and valves 84, 86 may be utilized to achieve and maintain the target junction temperature even though the fluid temperature may not be the desired temperature. The main pump 82 is operated to provide the pressurized fluid to the spray assembly 30.

If the semiconductors 18 being burned in have a relatively high profile (e.g. semiconductors 18 with integrated heat sinks which have a lower heat flux thereby requiring less fluid flow for cooling purposes), then both the first valve 84 and the second valve 86 are opened to provide fluid to the first portion 50 and the second portion 54 at a substantially constant pressure. As further shown in FIG. 16 of the drawings, fluid is sprayed from both the first orifices 52 and the second orifices 56 without the second portion 54 elevated with respect to the first portion 50.

If the semiconductors 18 being burned-in have a low profile within the socket as illustrated in FIG. 17 of the drawings (e.g. semiconductors 18 without integrated heat sinks which have a higher heat flux thereby requiring increased fluid flow for cooling purposes), then the first valve 84 is closed and the second valve 86 is opened with increased fluid pressure being supplied to the second portion 54 thereby extending the second portion 54 upwardly from the first portion 50 near the semiconductor 18.

It is desirable to decrease the distance D between the distal end of the second portion 54 and the surface of the semiconductor 18 when high heat flux conditions exist requiring additional cooling. Conversely, it is desirable to increase the distance D between the distal end of the second portion 54 and the surface of the semiconductor 18 when low heat flux conditions exist requiring less cooling.

Figure 3:
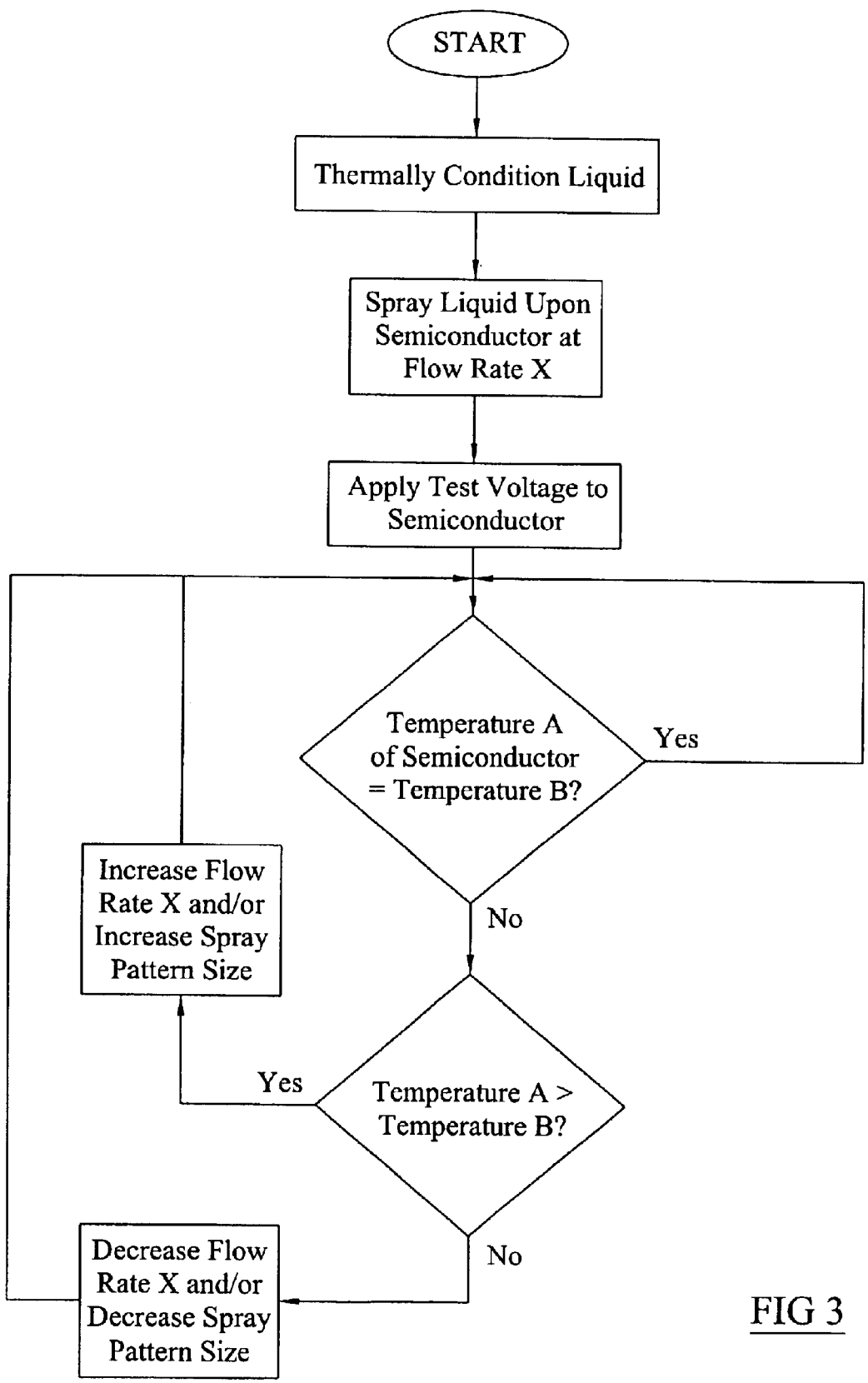
FIG. 3 is a flowchart illustrating the overall operation of the present invention.

As the fluid or fluid is sprayed upon the semiconductor 18, the control unit 60 applies the desired voltage to the semiconductors 18 for burn-in testing purposes thereby increasing or lowering the temperature of the semiconductor 18. If the temperature A of the semiconductor 18 rises above a desired temperature B (e.g. 100° Celsius), then the flow rate X of the fluid is increased to the spray units 40 as shown in FIG. 3 of the drawings. In addition to or independent of increasing the flow rate X, the spray pattern size emitted from one or more of the orifices 52, 56 may be increased to engage an increased surface of the semiconductor 18 of the semiconductor thereby increasing the cooling of the semiconductor 18. Instead of increasing the size of the spray pattern for increasing the cooling of the semiconductor, the spray pattern may also be directed to and focused upon a specific area of the semiconductor 18 that has a high heat flux compared to other areas of the semiconductor 18.

If the temperature A of the semiconductor 18 is lowered below a desired temperature B, then the flow rate X of the fluid is decreased to the spray units 40 as shown in FIG. 3 of the drawings. In addition to or independent of decreasing the flow rate X, the spray pattern size emitted from one or more of the orifices 52, 56 may be decreased to engage an reduced surface of the semiconductor 18 thereby reducing the cooling of the semiconductor 18. Instead of decreasing the size of the spray pattern for decreasing the cooling of the semiconductor, the spray pattern may also be directed away from a specific area of the semiconductor 18 that has a high heat flux compared to other areas of the semiconductor 18. In addition, the spray pattern may be increased in size thereby reducing the spray engaging high heat flux areas of the semiconductor 18.

If the temperature A of the semiconductor 18 is approximately equal to a desired temperature B, then the flow rate X of the fluid is maintained to the spray units 40 as shown in FIG. 3 of the drawings. In addition, the spray pattern size is preferably maintained relatively constant for each of the orifices 52, 56 where the temperature A of the semiconductor 18 is approximately equal to the desired temperature B.

In order to control the temperature A of the semiconductor 18, the power level may also be increased or lowered independently or in conjunction with the control of the fluid flow rate. The AC and DC power levels may be adjusted to manipulate the semiconductor's temperature.

Various methods of thermal management may be employed for the semiconductors 18. For adequately low heat fluxes, it may be appropriate to cool the semiconductors 18 through purely forced convection (i.e. no effective evaporation of the coolant occurs). For intermediate heat fluxes, it may be appropriate to utilize a combination of forced convection and phase change heat transfer (i.e. the latter method resulting in evaporation of the coolant). For the highest level of heat fluxes, it may be appropriate to optimize purely on phase change heat transfer. For optimization on an approach that is dominated by phase change, it is critical to have a system design and method of operation that allows the maintenance of a thin coolant film on the semiconductors at all times. Upon coolant delivery to the semiconductors 18, all coolant is returned to the reservoir 80 for reuse. In situations where vapor is generated, the system is designed such that the pressure generated by the vapor assists in the return of the vapor and any condensed or unevaporated coolant back to the reservoir 80.

As the fluid is sprayed upon the semiconductors 18, the fluid engaging the semiconductors 18 may be partially vaporized. The vapor is eventually condensed as the temperature of the vapor is reduced after shutdown. The vapor may also be condensed by pressure increases within the spray enclosure 20 or via the vapor recovery unit 70 during or after operation of the present invention. The non-vaporized fluid passes downwardly within the spray enclosure 20 to the fluid collector 28 where the fluid is then filtered and returned to the reservoir 80 for reuse.

This process continues until the semiconductors 18 are fully burned-in over the required amount of time. Once the burn-in process is completed, the flow of the fluid is terminated. All vapor is recovered during the fluid recovery phase, and unevaporated coolant on the burn-in board 12, sockets and other, is made to evaporate for subsequent recovery. The burn-in board 12 and semiconductors 18 are then removed from the spray enclosure 20 for replacement with other burn-in boards 12 and semiconductors 18.

As to a further discussion of the manner of usage and operation of the present invention, the same should be apparent from the above description. Accordingly, no further discussion relating to the manner of usage and operation will be provided.

With respect to the above description then, it is to be realized that the optimum dimensional relationships for the parts of the invention, to include variations in size, materials, shape, form, function and manner of operation, assembly and use, are deemed to be within the expertise of those skilled in the art, and all equivalent structural variations and relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

We claim:

1. A thermal management system for thermally managing at least one electronic device, comprising:

at least one spray unit comprised of a plurality of spray groups, wherein each of said plurality of spray groups are each comprised of at least one atomizer that is capable of dispersing a continuous spray of coolant towards at least one electronic device;

a plurality of valves, wherein each of said plurality of spray groups are fluidly connected to at least one of said plurality of valves; and at least one control unit in communication with said plurality of valves for controlling a coolant flow to each of said plurality of spray groups.

2. The thermal management system of claim 1, wherein if increased cooling of at least one electronic device is required, said coolant flow is increased through at least one of said plurality of valves.

3. The thermal management system of claim 1, wherein if decreased cooling of at least one electronic device is required, said coolant flow is decreased through at least one of said plurality of valves.

4. The thermal management system of claim 1, wherein said at least one atomizer has an adjustable spray characteristic.

5. The thermal management system of claim 4, wherein if increased cooling of at least one electronic device is required, said adjustable spray characteristic is adjusted for increasing cooling.

6. The thermal management system of claim 4, wherein if decreased cooling of at least one electronic device is required, said adjustable spray characteristic is adjusted for decreasing cooling.

7. The thermal management system of claim 1, wherein said continuous spray of coolant is comprised of a wide area droplet pattern.

8. A thermal management system for thermally managing at least one electronic device, comprising:

at least one spray unit comprised of a plurality of spray groups, wherein each of said plurality of spray groups are each comprised of at least one atomizer that is capable of dispersing a continuous spray of coolant towards at least one electronic device;

a pressurized coolant source;

a plurality of valves fluidly connected to said pressurized coolant source, wherein each of said plurality of spray groups are fluidly connected to at least one of said plurality of valves, and wherein said plurality of valves control a coolant flow to each of said plurality of spray groups; and at least one control unit in communication with said plurality of valves for controlling said plurality of valves.

9. The thermal management system of claim 8, wherein if increased cooling of at least one electronic device is required, said coolant flow is increased through at least one of said plurality of valves.

10. The thermal management system of claim 8, wherein if decreased cooling of at least one electronic device is required, said coolant flow is decreased through at least one of said plurality of valves.

11. The thermal management system of claim 8, wherein said at least one atomizer has an adjustable spray characteristic.

12. The thermal management system of claims 11, wherein if increased cooling of at least one electronic device is required, said adjustable spray characteristic is adjusted for increasing cooling.

13. The thermal management system of claim 11, wherein if decreased cooling of at least one electronic device is required, said adjustable spray characteristic is adjusted for decreasing cooling.

14. The thermal management system of claim 8, wherein said continuous spray of coolant is comprised of a wide area droplet pattern.

15. A thermal management system for thermally managing at least one electronic device, comprising:

at least one spray unit comprised of a plurality of spray groups, wherein each of said plurality of spray groups are each comprised of at least one atomizer that is capable of dispersing a continuous and non-incremental spray of coolant towards at least one electronic device;

wherein said continuous and non-incremental spray of coolant is comprised of a wide area droplet pattern;

at least one pump positioned external of said at least one spray unit capable of providing a pressurized coolant source;

a plurality of valves fluidly connected to said at least one pump for receiving pressurized coolant from said at least one pump, wherein each of said plurality of spray groups are fluidly connected to at least one of said plurality of valves, and wherein said plurality of valves control a coolant flow to each of said plurality of spray groups such that a coolant output flow rate of each of said plurality of spray groups may differ from one another; and at least one control unit in communication with said plurality of valves for controlling said plurality of valves.

16. The thermal management system of claim 15, wherein if increased cooling of at least one electronic device is required, said coolant flow is increased through at least one of said plurality of valves.

17. The thermal management system of claim 15, wherein if decreased cooling of at least one electronic device is required, said coolant flow is decreased through at least one of said plurality of valves.

18. The thermal management system of claim 15, wherein said at least one atomizer has an adjustable spray characteristic.

19. The thermal management system of claim 18, wherein if increased cooling of at least one electronic device is required, said adjustable spray characteristic is adjusted for increasing cooling.

20. The thermal management system of claim 18, wherein if decreased cooling of at least one electronic device is required, said adjustable spray characteristic is adjusted for decreasing cooling.

* * * * *

UNITED STATES PATENT AND TRADEMARK OFFICE
CERTIFICATE OF CORRECTION

PATENT NO.   : 6,857,283 B2
DATED        : February 22, 2005
INVENTOR(S)  : Charles L. Tilton et al.

It is certified that error appears in the above-identified patent and that said Letters Patent is hereby corrected as shown below:

Column 6,
Line 12, after "appreciated that the spray" please replace the word "units" with -- assembly --.

Column 9,
Line 14, after "various thickness, however it is" please replace the word "preferably" with -- preferable --.
Line 16, after "thicker inlet" please replace the word "place" with -- plate --.

Signed and Sealed this

Thirteenth Day of September, 2005

JON W. DUDAS
*Director of the United States Patent and Trademark Office*